United States Patent
Orofino et al.

(10) Patent No.: US 9,594,854 B1
(45) Date of Patent: Mar. 14, 2017

(54) USING ABSTRACT NODES TO TEST THE BEHAVIOR OF A DYNAMIC SYSTEM

(71) Applicant: THE MATHWORKS, INC., Natick, MA (US)

(72) Inventors: Donald P. Orofino, Sudbury, MA (US); Pieter J. Mosterman, Framingham, MA (US); David Koh, Boston, MA (US)

(73) Assignee: The MathWorks, Inc., Natick, MA (US)

( * ) Notice: Subject to any disclaimer, the term of this patent is extended or adjusted under 35 U.S.C. 154(b) by 1122 days.

(21) Appl. No.: 13/693,809

(22) Filed: Dec. 4, 2012

Related U.S. Application Data

(60) Provisional application No. 61/713,828, filed on Oct. 15, 2012, provisional application No. 61/715,034, filed on Oct. 17, 2012.

(51) Int. Cl.
*G06F 7/60* (2006.01)
*G06F 17/10* (2006.01)
*G06F 17/50* (2006.01)

(52) U.S. Cl.
CPC .................................. *G06F 17/50* (2013.01)

(58) Field of Classification Search
CPC . G06F 8/451; G06F 9/44; G06F 17/12; G06F 17/13; G06F 17/50; G06F 17/504
USPC ........................................................ 703/2
See application file for complete search history.

(56) References Cited

U.S. PATENT DOCUMENTS

| | | | | |
|---|---|---|---|---|
| 7,412,367 | B1 * | 8/2008 | Warlock | G06F 17/504 703/20 |
| 7,567,890 | B1 * | 7/2009 | Warlock | G06F 17/504 700/182 |
| 9,009,007 | B2 * | 4/2015 | Ali | G06F 8/30 703/2 |
| 2004/0225970 | A1 * | 11/2004 | Oktem | G06F 17/5059 716/114 |
| 2005/0257195 | A1 * | 11/2005 | Morrow | G06F 8/34 717/109 |

(Continued)

OTHER PUBLICATIONS

Barker et al. "Interactive Graphics for the Computer-Aided Design of Dynamic Systems". Jun. 1987. IEEE. pp. 19-25.*

(Continued)

*Primary Examiner* — Eunhee Kim
(74) *Attorney, Agent, or Firm* — Harrity & Harrity, LLP

(57) ABSTRACT

A device may receive information specifying a physical time delay of a computational node of a first computational graph. The first computational graph may include a group of computational nodes that are connected in a particular manner, and may represent at least a portion of a dynamic system. The device may further add an abstract node to a second computational graph based on the received information. The abstract node may correspond to the computational node and may implement the physical time delay when the second computational graph is executed. The second computational graph may include a group of abstract nodes that are connected in the particular manner. The device may also execute the second computational graph, and may obtain one or more behavioral characteristics of the at least the portion of the dynamic system based on executing the second computational graph.

21 Claims, 22 Drawing Sheets

(56) References Cited

U.S. PATENT DOCUMENTS

2011/0078652 A1* 3/2011 Mani ................. G06F 8/10
717/105
2014/0047421 A1* 2/2014 Shimizu ............. G06F 17/12
717/149

OTHER PUBLICATIONS

Jackson et al., "Components, Platforms and Possibilities: Towards Generic Automation for MDA," EMSOFT'10, Oct. 24-29, 2010, Arizona (10 total pages).

* cited by examiner

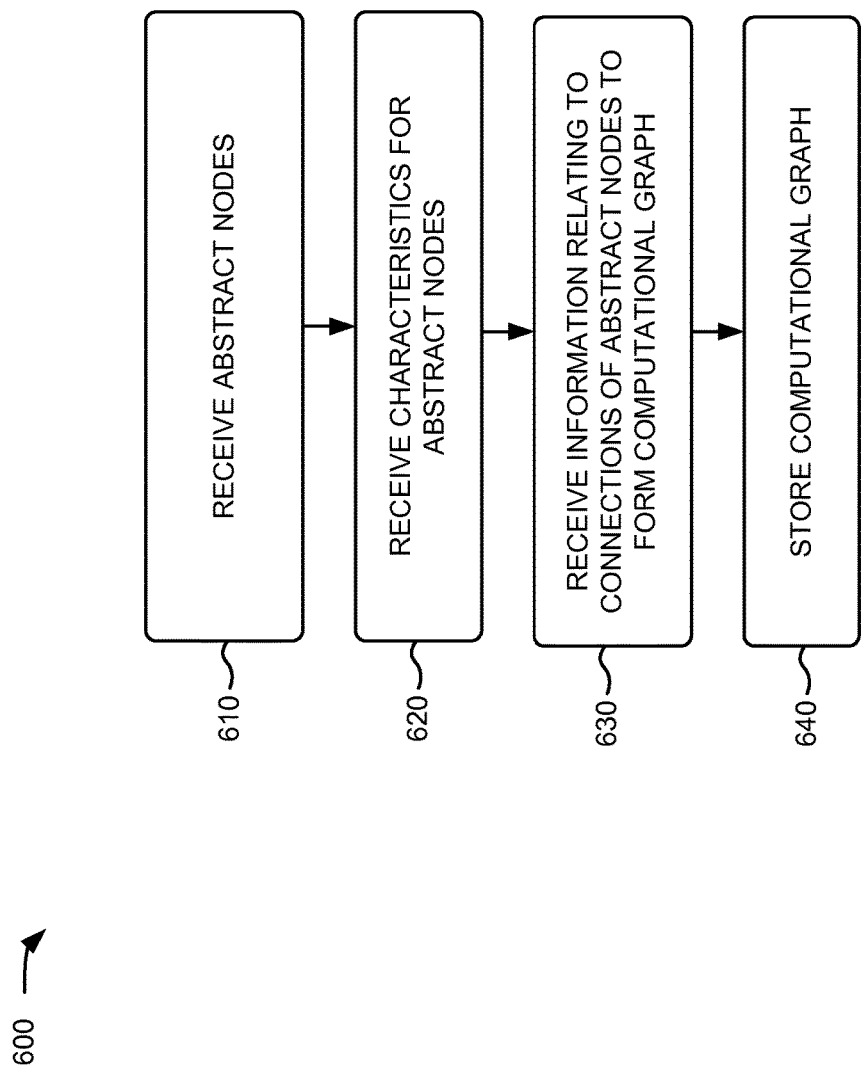

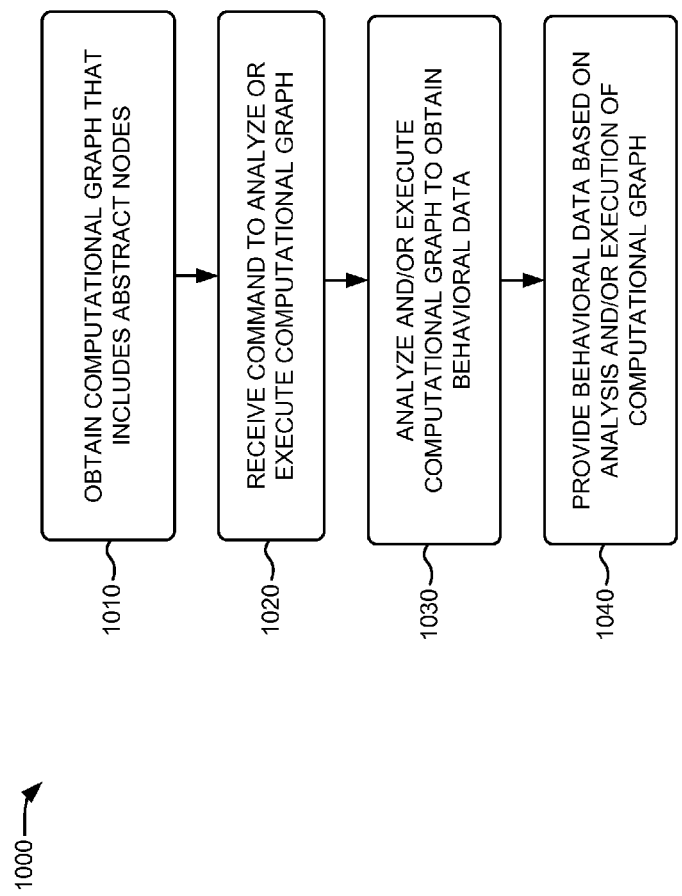

REPORT

SPEED (in seconds)

Abstract Nodes:
X0 – 0.20
B0 – 0.20
C0 – 0.15
C1 – 0.15
D1 – 0.15
D2 – 0.15
B1 – 0.10
C2 – 0.10
D4 – 0.10
B2 – 0.05
D0 – 0.05
D3 – 0.05

Chains:
D0-D4 – 0.50
C0-C2 – 0.40
B0-B2 – 0.35

Fastest Node: B2, D0, D3
Slowest Node: X0, B0
Fastest Chain: B0-B2
Slowest Chain: D0-D4

FIG. 11B

USING ABSTRACT NODES TO TEST THE BEHAVIOR OF A DYNAMIC SYSTEM

RELATED APPLICATIONS

This application claims priority to U.S. Provisional Patent Application No. 61/713,828, filed Oct. 15, 2012, and U.S. Provisional Patent Application No. 61/715,034, filed Oct. 17, 2012, the disclosures of both of these provisional application are incorporated by reference herein in their entirety.

BRIEF DESCRIPTION OF THE DRAWINGS

FIG. 6 is a flowchart of an example process for creating a computational graph that includes abstract nodes;

FIG. 10 is a flowchart of an example process for obtaining behavioral data based on analyzing and/or executing a computational graph that includes abstract nodes; and FIGS. 11A-11D are an example of the process described in FIG. 10.

DETAILED DESCRIPTION

Figure 1A:
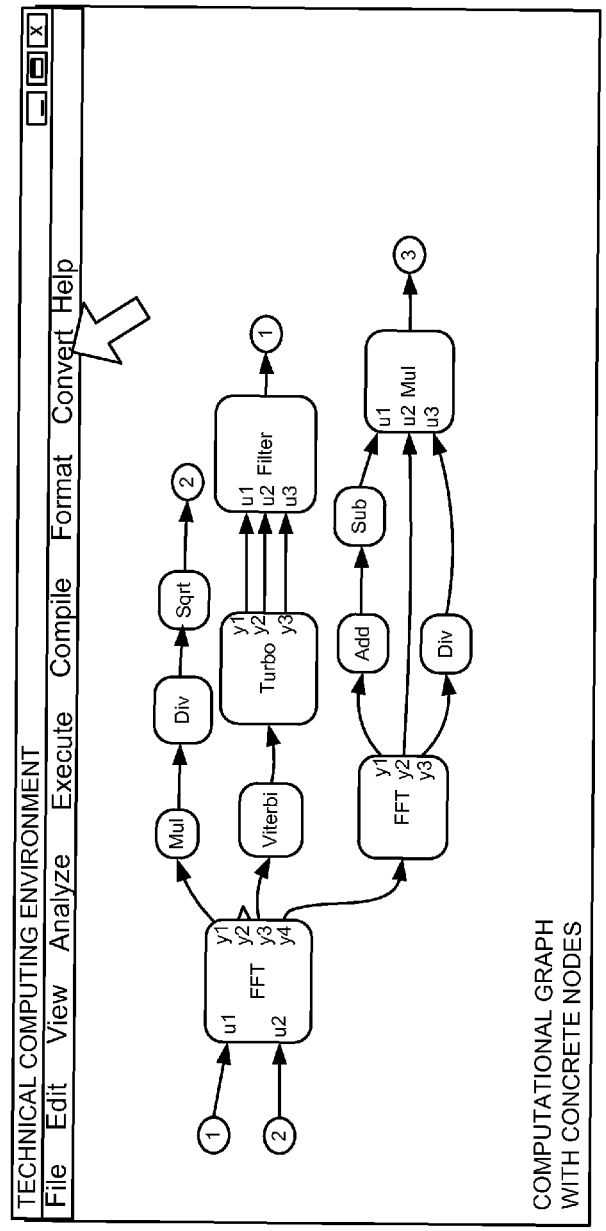
FIGS. 1A-1D are diagrams of an example overview of an implementation described herein.

The following detailed description of example embodiments refers to the accompanying drawings. The same reference numbers in different drawings may identify the same or similar elements.

Computational graphs may be used as part of the development of a computational system. There may be instances where a designer is interested in testing the computational system, but one or more portions of the computational graph are unavailable, such as those instances where the one or more portions, of the computational graph, have not yet been developed. In addition, even in those situations where all the portions of the computational graph are available, execution of the computational graph may be costly, and characteristics, obtained by executing the computational graph, may fluctuate from one execution to the next, or throughout the course of a single long execution. This fluctuation may give rise to difficulty when exploring the impact of compilation settings, compiler optimizations, and/or other characterizations of importance during the exploration or testing phase of the computational system.

Systems and/or methods, as described herein, may provide an abstract node that may be used as a computational model architectural planning element. The abstract node may model the physical time delays, logical execution delays, and/or other aspects that serve to characterize a concrete computational node in a computational graph. By using abstract nodes, in place of concrete computational nodes in a computational graph, the behavior of the computational system may be captured and repeatedly executed. In this way, a designer of a computational system may analyze and/or execute a computational graph that includes abstract nodes for performance optimization purposes, design space exploration purposes, and/or computational system testing purposes.

A computational graph may be configured to implement a dynamic system (e.g., a mechanical device, an electrical device, a human organ, a physical phenomena, etc.). The computational graph may generally correspond to a representation of interconnected computational nodes, where data dependencies, timing, ordering, and manners in which data is shared between computational nodes are well defined. The computational graph may include concrete computational nodes (referred to hereinafter as "concrete nodes"), abstract nodes, or a combination of concrete nodes and abstract nodes.

A concrete node may generally refer to a computational node that represents a computational algorithm in a computational graph. The concrete node may include an elemental dynamic system (e.g., a differential equation, a difference equation, an algebraic equation, etc.), and/or a state transition system. The concrete node may be associated with a number of characteristics, such as characteristics relating to physical and/or logical time, memory consumption and accesses, power consumption, etc. The concrete node may correspond to the final form of the computational node that is used in the computational graph.

An abstract node may generally refer to a computational node that is an intermediate form of a concrete node. The abstract node may be associated with one or more characteristics with which the concrete node is associated. A characteristic with which the abstract node is associated may approximate the corresponding characteristic of the concrete node with varying levels of precision. The fidelity of an abstract node relates to the number of characteristics associated with the abstract node and/or the precision of one or more of those characteristics. In its simplest form, the abstract node may be configured to implement a physical time delay that relates to an amount of time that the concrete node takes to execute when the computational graph is executed.

A computational system may generally correspond to a physical system having one or more computational resources, such as multiple Central Processing Units (CPUs) or cores, Field Programmable Gate Arrays (FPGAs), Graphics Processing Units (GPUs), and/or other elements that can be used for computation. A compiler may be used to schedule the computational nodes of the computational graph, allocate hardware resources, such as memory and CPUs, to the computational nodes and to the connections that interconnect the computational nodes.

Systems and/or methods, as described herein, may use a computing environment, such as a technical computing environment (TCE), for the operations described herein. A TCE may include any hardware and/or software based logic that provides a computing environment that allows tasks to be performed (e.g., by users) related to disciplines, such as, but not limited to, mathematics, science, engineering, medicine, and business. The TCE may include text-based environments (e.g., MATLAB® software), a graphically-based environment (e.g., Simulink® software, Stateflow® software, SimEvents® software, etc., by The MathWorks, Inc.; VisSim by Visual Solutions; LabView® by National Instruments; etc.), or another type of environment, such as a hybrid environment that may include, for example, one or more of the above-referenced text-based environments and one or more of the above-referenced graphically-based environments. Thus, while the description below focuses on a graphically-based environment, systems and/or methods, described herein, are equally applicable to text-based environments and hybrid environments.

The TCE may be integrated with or operate in conjunction with a graphical modeling environment, which may provide graphical tools for constructing computational graphs, systems, or processes. The TCE may include additional tools, such as tools designed to convert a computational graph into an alternate representation, such as source computer code, compiled computer code, or a hardware description (e.g., a description of a circuit layout). In some implementations, the TCE may provide this ability using graphical toolboxes (e.g., toolboxes for signal processing, image processing, color manipulation, data plotting, parallel processing, etc.). In some implementations, the TCE may provide these functions as block sets. In some implementations, the TCE may provide these functions in another way.

Computational graphs generated with the TCE may be, for example, models of a physical system, a computing system, an engineered system, an embedded system, a biological system, a chemical system, etc.

A computational graph generated with the TCE may include, for example, any equations, assignments, constraints, computations, algorithms, and/or process flows. The computational graph may be implemented as, for example, time-based block diagrams (e.g., via the Simulink software), discrete-event based diagrams (e.g., via the SimEvents software), dataflow diagrams, state transition diagrams (e.g., via the Stateflow software), software diagrams, a textual array-based and/or dynamically typed language (e.g., via the MATLAB software), a list or tree, and/or another form.

As previously mentioned, an example implementation of the TCE may use one or more text-based products, such as textual modeling environments. For example, a text-based modeling environment, may be implemented using additional products such as, but not limited to Octave, Python, Comsol Script, and MATRIXx from National Instruments; Mathematica from Wolfram Research, Inc.; Mathcad from Mathsoft Engineering & Education Inc.; Maple from Maplesoft; Extend from Imagine That Inc.; Scilab from The French Institution for Research in Computer Science and Control (INRIA); Virtuoso from Cadence; or Modelica or Dymola from Dynasim. In some implementations, the text-based modeling environment may include hardware and/or software based logic that provides a computing environment that allows users to perform tasks related to disciplines, such as, but not limited to, mathematics, science, engineering, medicine, business, etc., more efficiently than if the tasks were performed in another type of computing environment, such as an environment that required the user to develop code in a conventional programming language, such as C++, C, Fortran, Pascal, etc.

In some implementations, the text-based modeling environment may include a dynamically-typed language that may be used to express problems and/or solutions in mathematical notations. For example, the modeling environment may use an array as a basic element, where the array may not require dimensioning. These arrays may be used to support array programming in that operations can apply to an entire set of values, such as values in an array. Array programming may allow array-based operations to be treated as a high-level programming technique or model that lets a programmer think and operate on entire aggregations of data without having to resort to explicit loops of individual non-array, i.e., scalar operations.

The text-based modeling environment may further be adapted to perform matrix and/or vector formulations that may be used for data analysis, data visualization, application development, simulation, modeling, algorithm development, etc. These matrix and/or vector formulations may be used in many areas, such as statistics, finance, image processing, signal processing, control design, life sciences, education, discrete event analysis and/or design, state based analysis and/or design, etc.

In some implementations, the TCE may be implemented in a graphically-based modeling environment using products such as, but not limited to; VisSim by Visual Solutions; LabView® by National Instruments; Dymola by Dynasim; SoftWIRE by Measurement Computing; WiT by DALSA Coreco; VEE Pro or SystemVue by Agilent; Vision Program Manager from PPT Vision; Khoros from Khoral Research; Gedae by Gedae, Inc.; Scicos from (INRIA); Virtuoso from Cadence; Rational Rose from IBM; Rhapsody or Tau from Telelogic; Ptolemy from the University of California at Berkeley; or aspects of a Unified Modeling Language (UML) or SysML environment.

FIGS. 1A-1D are diagrams illustrating an overview 100 of an example implementation described herein. With reference to FIG. 1A, assume a user, of a computing device, has created, in a TCE, a computational graph that includes a number of interconnected concrete nodes. Assume that the user desires to test the behavior of the computational graph, but has found that testing of the computational graph is too costly. Thus, the user may elect to convert the concrete nodes, in the computational graph, into abstract nodes. As shown in FIG. 1A, the user may initiate the conversion process by, for example, selecting an appropriate menu item.

Figure 1B:
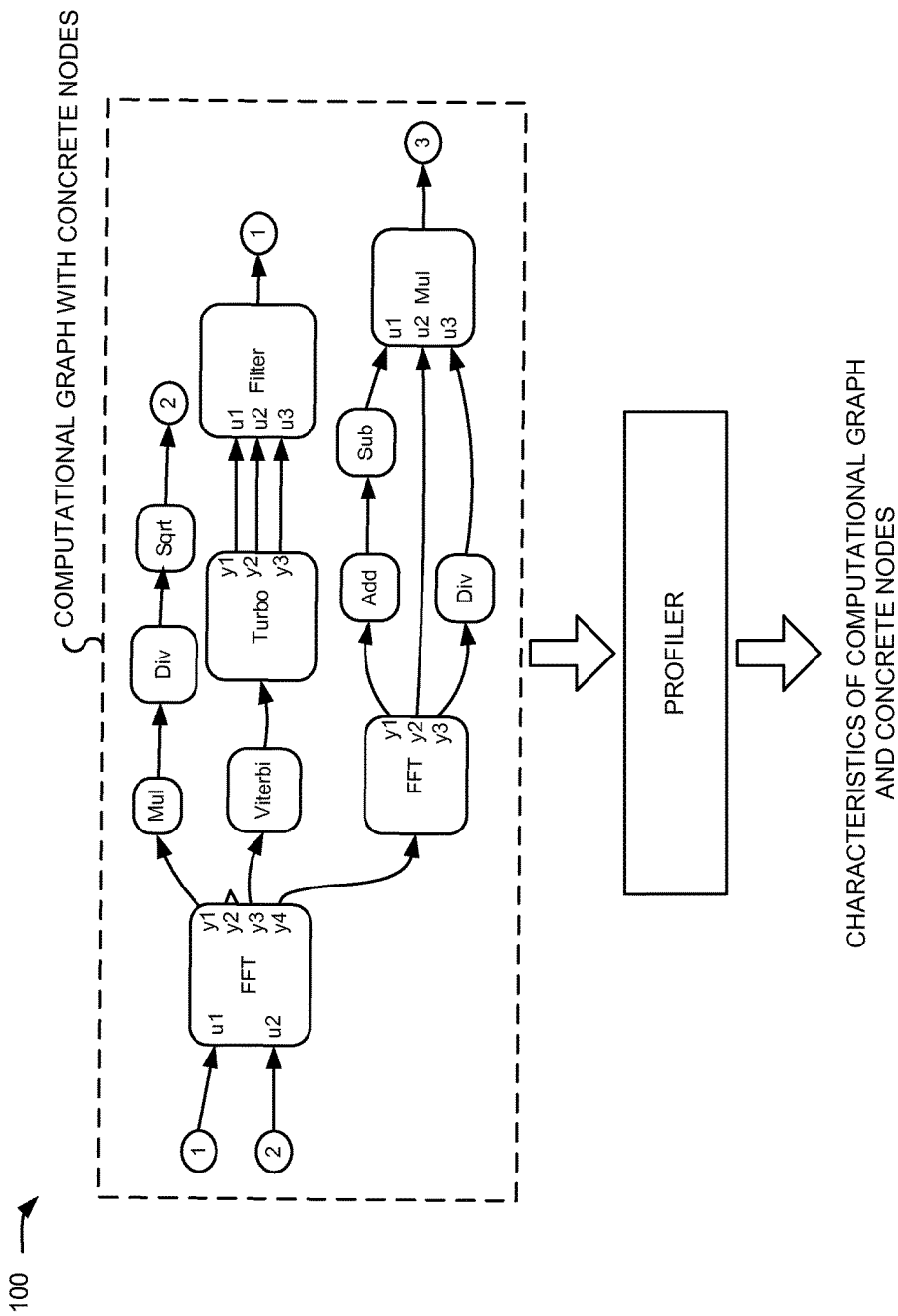

With reference to FIG. 1B, a profiler may obtain characteristics of the computational graph and the individual concrete nodes. For example, the profiler may determine the quantity of concrete nodes in the computational graph, the manner in which the concrete nodes are interconnected in the computational graph, the order of execution of the concrete nodes when the computational graph is executed, and/or other information relating to the computational graph. Additionally, or alternatively, the profiler may determine the quantity of ports with which each concrete node is associated, timing information associated with each concrete node, and/or other information relating to the concrete nodes.

Figure 1C:
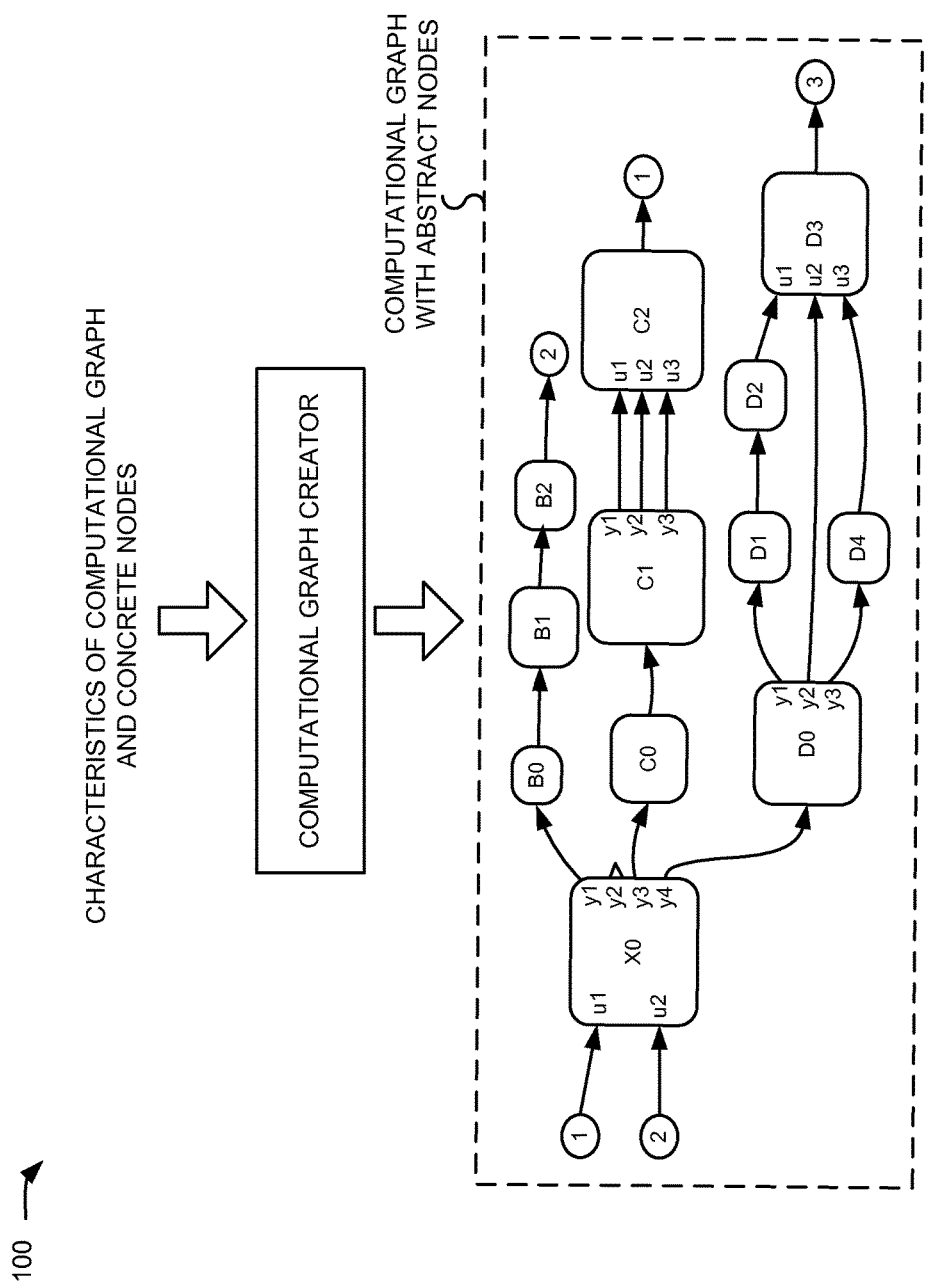

With reference to FIG. 1C, a computational graph creator may use the characteristics of the computational graph and the concrete nodes to create a computational graph that includes abstract nodes. The created computational graph may include the same quantity of nodes as the computational graph, with the same interconnections and execution order as the computational graph. Thus, each abstract node, in the created computational graph, may correspond to a concrete node in the computational graph. The computational graph creator may import the extracted characteristics of the concrete node into the corresponding abstract node. By way of example and with reference back to FIG. 1B, assume that the profiler has extracted, for the concrete node, named "Filter," the following characteristics: 3 inputs, 1 output, and an execution time of 20 milliseconds. Thus, with reference back to FIG. 1C, the computational graph creator has created an abstract node, named "C2" in FIG. 1C, and imported the extracted characteristics (i.e., the computational graph creator has caused abstract node C2 to have 3 inputs, 1 output, and a physical time delay of 20 milliseconds).

Figure 1D:
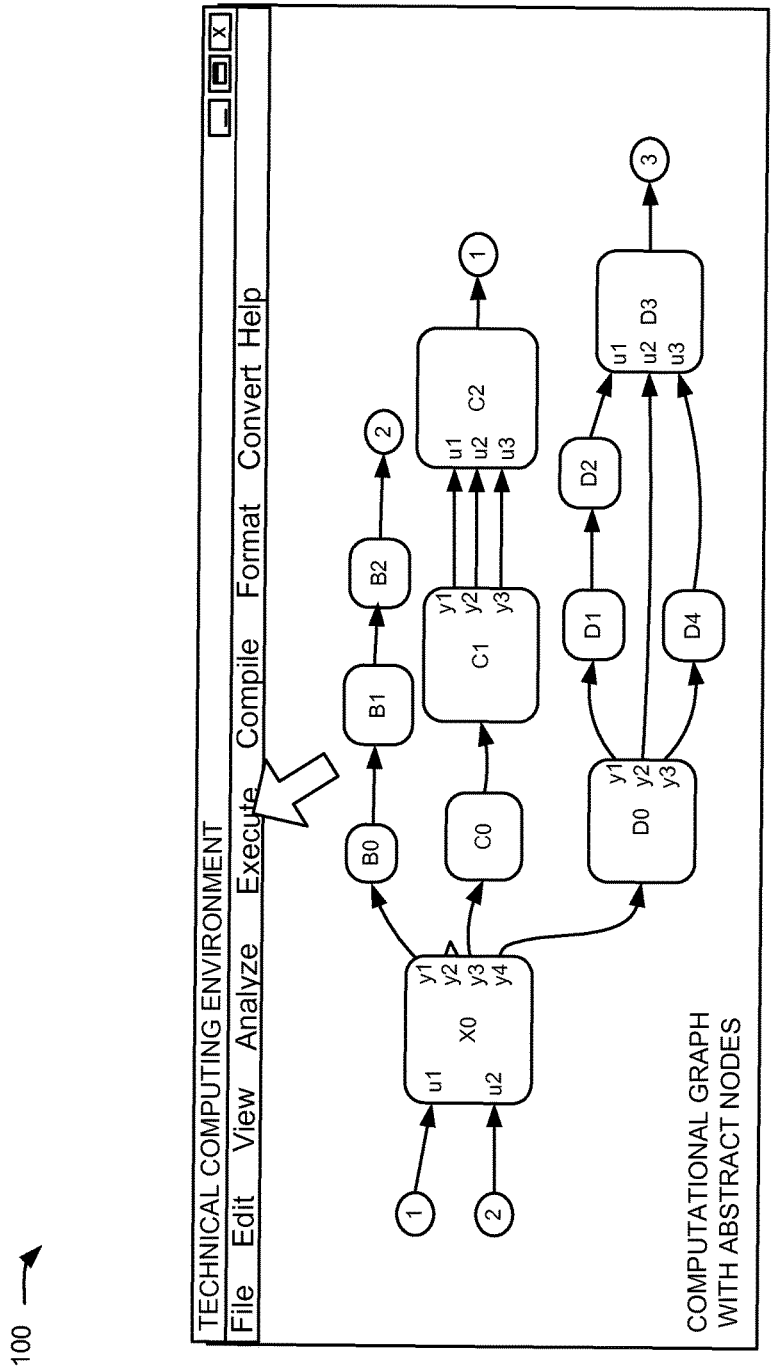

With reference to FIG. 1D, the computational graph creator may cause the created computational graph, with the abstract nodes, to be presented to the user. The user may now analyze and/or execute the created computational graph to obtain behavior data relating to the computational graph with the concrete nodes. The obtained behavior data may aid in performance optimization, computational system testing, and design space exploration. For example, the user may determine, based on analyzing the created computational graph, that the physical time delay associated with a particular abstract node is too short. Thus, by analyzing the created computational graph, the user may identify changes that are to be made to the computational graph with the concrete nodes. In this example, the user may introduce additional delays into the computational graph with the concrete nodes.

Figure 2:
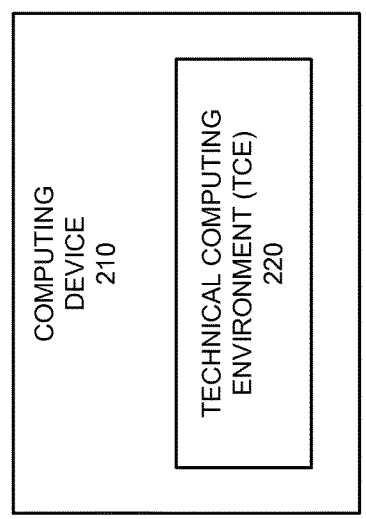
FIG. 2 is a diagram of an example environment in which systems and/or methods, described herein, may be implemented.

FIG. 2 is a diagram of an example environment 200 in which systems and/or methods, described herein, may be implemented. As illustrated, environment 200 may include a computing device 210.

Computing device 210 may include one or more devices that gather, process, search, store, and/or provide information in a manner similar to that described herein. For example, computing device 210 may include a server, a workstation, a mainframe, a computer (e.g., a desktop computer, a laptop computer, a tablet computer, etc.), and/or some other type of computational device. Computing device 210 may generate, compile, and/or execute code.

Computing device 210 may host a TCE 220. TCE 220 may include hardware-based logic or a combination of hardware and software-based logic that provides a computing environment. TCE 220 may permit a user to perform tasks related to a discipline or a domain. For example, TCE 220 may pertain to mathematics, science, engineering, medicine, business, and/or another type of discipline or domain in a manner similar to that described above. In some implementations, TCE 220 may be hosted by another device, such as a server, that is located remotely from computing device 210.

Although FIG. 2 shows example components of environment 200, in some implementations, environment 200 may include additional components, fewer components, or different components than those depicted in FIG. 2.

Figure 3:
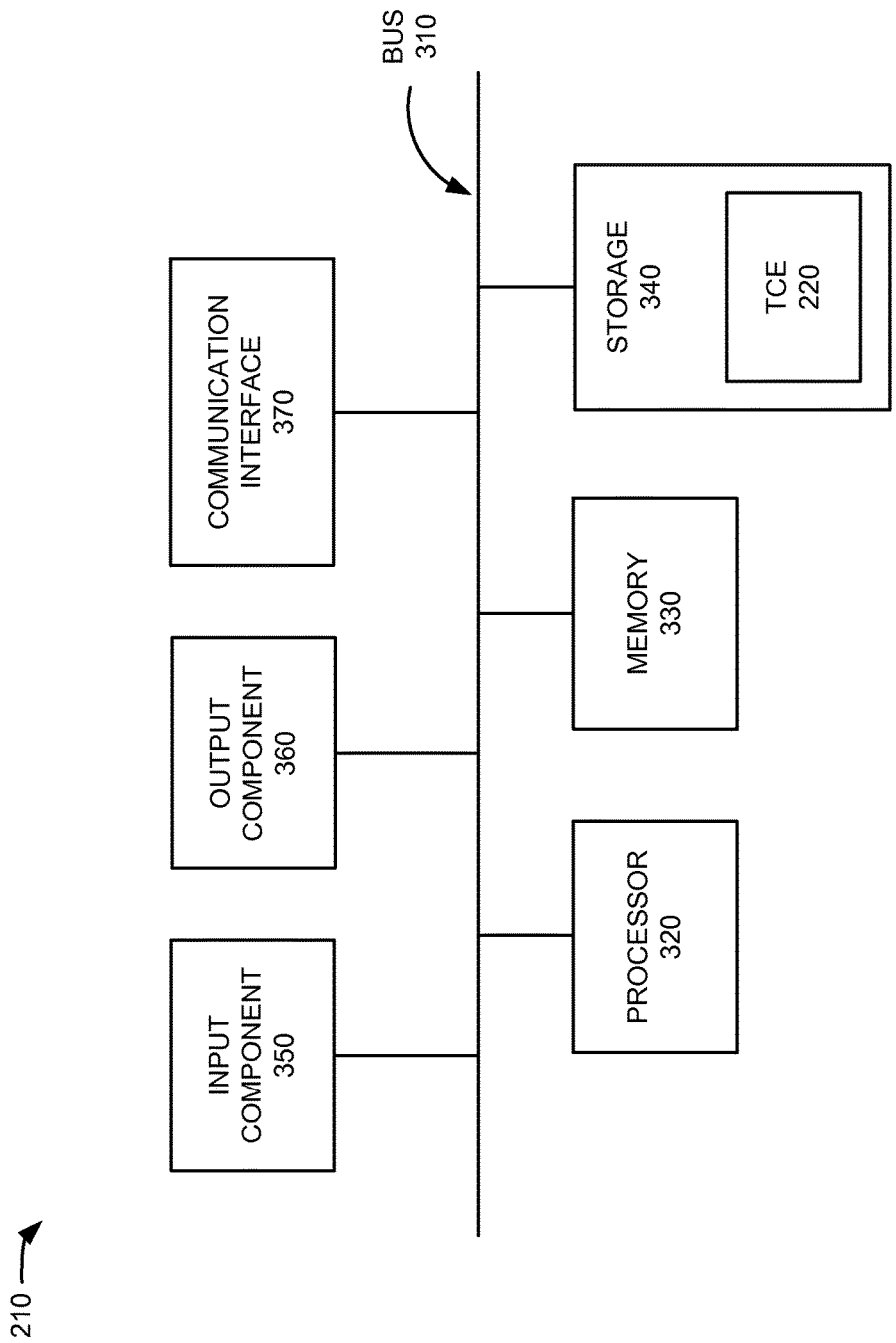
FIG. 3 is a diagram of example components of a computing device of FIG. 2 according to one or more implementations described herein.

FIG. 3 is a diagram of example components of computing device 210. As shown in FIG. 3, computing device 210 may include a bus 310, a processor 320, a memory 330, storage 340, an input component 350, an output component 360, and/or a communication interface 370.

Bus 310 may permit communication among the other components of computing device 210. For example, bus 310 may include a system bus, an address bus, a data bus, and/or a control bus. Bus 310 may also include bus drivers, bus arbiters, bus interfaces, and/or clocks.

Processor 320 may interpret and/or execute instructions. For example, processor 320 may include a general-purpose processor, a microprocessor, a data processor, a GPU, a processing core, an application specific integrated circuit (ASIC), an application specific instruction-set processor (ASIP), a system-on-chip (SOC), a programmable logic device (PLD), a chipset, and/or a field-programmable gate array (FPGA).

Memory 330 may store data and/or instructions related to the operation and use of computing device 210. For example, memory 330 may store data and/or instructions that may be configured to implement an implementation described herein. Memory 330 may include, for example, a random access memory (RAM), a dynamic random access memory (DRAM), a static random access memory (SRAM), a synchronous dynamic random access memory (SDRAM), a ferroelectric random access memory (FRAM), a read only memory (ROM), a programmable read only memory (PROM), an erasable programmable read only memory (EPROM), an electrically erasable programmable read only memory (EEPROM), and/or a flash memory.

Storage 340 may store data and/or software related to the operation and use of computing device 210. For example, storage 340 may include a hard disk (e.g., a magnetic disk, an optical disk, a magneto-optic disk, a solid state disk, etc.), a compact disc (CD), a digital versatile disc (DVD), a floppy disk, a cartridge, a magnetic tape, and/or another type of computer-readable medium, along with a corresponding drive. Memory 330 and/or storage 340 may also include a storage device external to and/or removable from computing device 210, such as a Universal Serial Bus (USB) memory stick, a hard disk, etc. In an implementation, as illustrated, storage 340 may store TCE 220.

Input component 350 may permit the user and/or another device to input information into computing device 210. For example, input component 350 may include a keyboard, a keypad, a mouse, a display (e.g., a touch screen), a touchpad, a button, a switch, a microphone, a camera, an accelerometer, a gyroscope, neural interface logic, voice recognition logic, an input port, and/or some other type of input component. Output component 360 may permit computing device 210 to output information to the user and/or another device. For example, output component 360 may include a display, a speaker, a light emitting diode (LED), a haptic device, a tactile device, an output port, and/or some other type of output component.

Communication interface 370 may permit computing device 210 to communicate with other devices and/or systems via one or more networks. Communication interface 370 may include a transceiver-like component. For example, communication interface 370 may include an Ethernet interface, an optical interface, a coaxial interface, a radio interface, and/or some other type of wireless and/or wired interface.

As will be described in detail below, computing device 210 may perform certain operations relating to implementations described herein. Computing device 210 may perform these operations in response to processor 320 executing software instructions (e.g., computer program(s)) contained in a computer-readable medium, such as memory 330 and/or storage 340. A computer-readable medium may be defined as a non-transitory memory device. A memory device may include space within a single physical memory device or spread across multiple physical memory devices. The software instructions may be read into memory 330 from another computer-readable medium, such as storage 340, or from another device via communication interface 370. The software instructions contained in memory 330 may cause processor 320 to perform processes described herein. Alternatively, hardwired circuitry may be used in place of or in combination with software instructions to implement processes described herein. Thus, implementations described herein are not limited to any specific combination of hardware circuitry and software.

Although FIG. 3 shows example components of computing device 210, in some implementations, computing device 210 may include additional components, fewer components, different components, or differently arranged components than those depicted in FIG. 3. Additionally, or alternatively, one or more components of computing device 210 may perform one or more tasks described as being performed by one or more other components of computing device 210.

Figure 4:
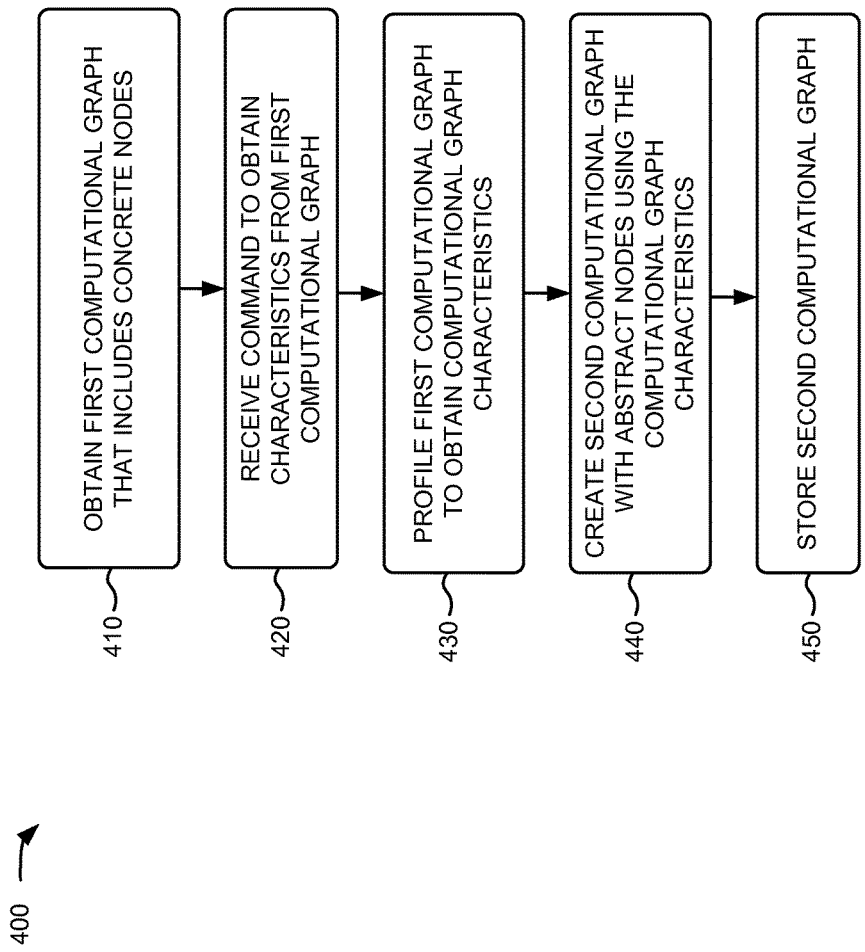
FIG. 4 is a flowchart of an example process for converting a computational graph that includes concrete nodes into a computational graph that includes abstract nodes.

FIG. 4 is a flowchart of an example process 400 for converting a computational graph that includes concrete nodes into a computational graph that includes abstract nodes. In some implementations, process 400 may be performed by computing device 210. In some implementations, one or more blocks of process 400 may be performed by one or more devices instead of, or possibly in conjunction with, computing device 210.

Process 400 may include obtaining a first computational graph that includes concrete nodes (block 410). For example, computing device 210 (e.g., TCE 220) may receive a request, from a user of computing device 210, to access a first computational graph. The first computational graph may include concrete nodes. The request may include information identifying the computational graph, such as a name of the computational graph, and information identifying a memory location at which the computational graph is stored. The memory location may be located within computing device 210 or external to, and possibly remote from, computing device 210. Computing device 210 may, based on receiving the request, retrieve the first computational graph from the memory location. In some implementations, computing device 210 may provide, for display, a user interface that depicts all or a portion of the first computational graph.

Process 400 may include receiving a command to obtain characteristics from the first computational graph (block 420). For example, computing device 210 (e.g., TCE 220) may receive a command, from the user, to obtain characteristics from the first computational graph that includes concrete nodes. In some implementations, computing device 210 may receive the command based on detecting a selection of a particular menu item, entry of a particular textual or audible input from the user, and/or entry of some other predetermined input that identifies a desire to obtain characteristics from the first computational graph.

In some implementations, the command may include a command to obtain characteristics from all the concrete nodes in the first computational graph. In some implementations, the command may identify a particular concrete node or a particular group of concrete nodes from which characteristics are to be obtained. Thus, computing device 210 may parse the command to determine whether characteristics are to be obtained from all or a portion of the concrete nodes of the first computational graph. In some implementations, the command may simply include instructions to obtain characteristics. In these implementations, computing device 210 may provide, based on receiving the command, a user interface, to the user, to allow the user to specify the concrete nodes from which characteristics are to be obtained. Other manners of specifying the particular concrete nodes from which characteristics are to be obtained may alternatively be used.

Process 400 may include profiling the first computational graph to obtain computational graph characteristics (block 430). For example, computing device 210 (e.g., TCE 220) may profile the first computational graph to obtain characteristics relating to the first computational graph. To profile the first computational graph, computing device 210 may analyze and/or execute the first computational graph. The characteristics may include any characteristics of the first computational graph that may be used to represent behavior of the concrete nodes. For example, the characteristics may include characteristics relating to the individual concrete nodes, characteristics relating to the interconnection of the concrete nodes in the first computational graph, and/or characteristics relating to an execution order of the concrete nodes in the first computational graph. Other characteristics may also or alternatively be obtained.

As an example, computing device 210 may analyze the first computational graph and identify the quantity of concrete nodes in the first computational graph. In some implementations, computing device 210 may identify, for each individual concrete node, the quantity of input ports and the quantity of output ports with which the individual concrete node is associated.

In some implementations, computing device 210 may identify characteristics relating to a physical time delay associated with each individual concrete node. The physical time delay may relate to an idling time and/or an actual time for executing the algorithm of the individual concrete node. For example, the physical time delay characteristics may be expressed as a fastest execution time of the individual concrete node, the slowest execution time of the individual concrete node, an average execution time of the individual concrete node, and/or in another manner. The physical time delay characteristics may further relate to an execution time as measured in a particular environment, such as on a particular type of processor, a particular emulator, a particular FPGA, in a Hardware Description Level (HDL) model simulator, etc. In some implementations, computing device 210 may obtain the physical time delay characteristics, for an individual concrete node, on a per step basis, a per output process basis, and/or a per update process basis.

In some implementations, computing device 210 may identify characteristics relating to a logical time delay associated with each individual concrete node. The logical time delay may correspond to the latency between an input port of the individual concrete node and an output port of the individual concrete node. In some implementations, computing device 210 may identify the logical time delay based on the quantity of computational calls or algorithm executions that are needed for the individual concrete node to produce an output value based on one or more input values. In some implementations, computing device 210 may obtain the logical time delay characteristics, for an individual concrete node, on a per output process basis and/or a per update process basis. Other manners of identifying the logical time delay may alternatively be used.

In some implementations, computing device 210 may identify characteristics relating to memory consumption associated with each individual concrete node. For example, computing device 210 may identify the memory consumption based on the quantity of bytes of memory allocated for each input port and each output port of the individual concrete node. In some implementations, computing device 210 may identify the data type at each input port and each output port of the individual concrete node (e.g., a single, an integer, a fixed point, etc.), along with the quantity of elements of the data type. Additionally, or alternatively, computing device 210 may also identify other characteristics of the data at each input port and each output port, such as complex-values. In some implementations, computing device 210 may infer characteristics of the data for an individual concrete node by analyzing the data input or output from other concrete nodes. Other manners of identifying the memory consumption may alternatively be used.

In some implementations, computing device 210 may identify characteristics relating to memory accesses associated with each individual concrete node. For example, computing device 210 may identify the memory accesses based on the quantity of bytes of memory that is to be read and written for each output port of the individual concrete node. As another example, computing device 210 may identify the quantity of write operations and/or read operations to/from memory. Other manners of identifying the memory accesses may alternatively be used.

In some implementations, computing device 210 may identify characteristics relating to the interconnections of the individual concrete nodes in the first computational graph. For example, computing device 210 may identify, for a particular connection between two concrete nodes, the output port of one concrete node and the input port of the other concrete node that are part of the particular connection.

In some implementations, computing device 210 may identify characteristics relating to the execution order of the individual concrete nodes of the first computational graph. For example, computing device 210 may execute the first computational graph and determine the order in which the individual concrete nodes execute.

In some implementations, computing device 210 may identify other characteristics relating to the computational graph, such as power consumption, the quantity of interrupt routine invocations, the quantity of messages sent or received, and/or any other characteristics of the first computational graph that may be used to represent behavior of the concrete nodes.

In some implementations, computing device 210 may provide a user interface, to the user, to allow the user to specify which characteristic(s) are to be obtained from the first computational graph. Computing device 210 may then only obtain the specified characteristic(s).

Computing device 210 may obtain the computational graph characteristics in other ways. For example, the computational graph characteristics may be automatically determined by a system (e.g., based on information relating to the first computational graph or a different computational graph), may be automatically generated from a measurement test bed with elementary C code embedded in a small test environment, may be computed based on elementary computations (e.g., such as an assembly listing), may be supplied by the user (e.g., as a number, an equation, an algorithm, a text or graphical model, etc.), etc.

Process 400 may include creating a second computational graph using the computational graph characteristics (block 440). For example, computing device 210 (e.g., TCE 220) may use the characteristics, obtained from the first computational graph, to create the second computational graph. The second computational graph may include the same quantity of nodes, connected in the same manner, as in the first computational graph. However, each concrete node, from the first computational graph, may be replaced with an abstract node that includes the characteristics extracted from the corresponding concrete node. For example, assume that computing device 210 extracted the following characteristics from a particular concrete node of the first computational graph: two input ports, three output ports, and an execution time of 200 milliseconds. Computing device 210 may create a corresponding abstract node that has two input ports and three output ports and is associated with a physical time delay of 200 milliseconds.

In some implementations, computing device 210 may include, in an abstract node, the ability to generate code. For example, computing device 210 may configure the abstract node with the ability to generate C code, Hardware Description Language (HDL) code, and/or another type of code.

In some implementations, computing device 210 may create the second computational graph in the same TCE as is used in creating the first computational graph. For example, computing device 210 may create the first computational graph and the second computational graph in TCE 220.

Process 400 may include storing the second computational graph (block 450). For example, computing device 210 (e.g., TCE 220) may store the second computational graph in a memory location (e.g., in memory 330 and/or storage 340 of FIG. 3). In some implementations, computing device 210 may receive information, identifying the memory location, from the user and may store the second computational graph at the identified memory location.

While FIG. 4 shows process 400 as including a particular quantity and arrangement of blocks, in some implementations, process 400 may include fewer blocks, additional blocks, or a different arrangement of blocks. Additionally, or alternatively, some of the blocks may be performed in parallel.

Figure 5:
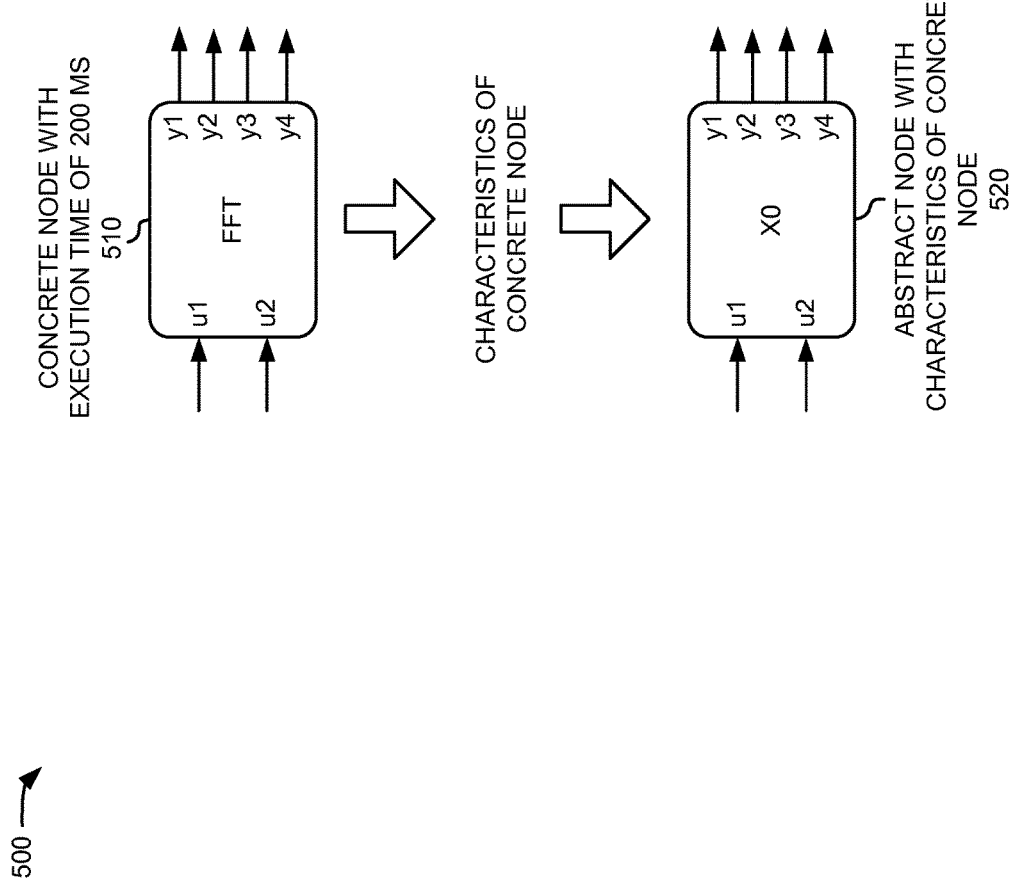
FIG. 5 is an example of the process described in FIG. 4.

FIG. 5 is an example 500 of process 400 described above with respect to FIG. 4. As shown, a concrete node 510 may be profiled to obtain characteristics of the concrete node (e.g., characteristics that allow the behavior of the concrete node to be represented). A corresponding abstract node 520 may then be created that includes the obtained characteristics. Assume, for example 500, that profiling concrete node 510 resulted in identifying the following characteristics: 2 inputs, 4 outputs, and an execution time of 200 milliseconds. Abstract node 520 may be created to include 2 inputs and 4 outputs, and be associated with a physical time delay of 200 milliseconds.

FIG. 6 is a flowchart of an example process 600 for creating a computational graph that includes abstract nodes. In some implementations, process 600 may be performed by computing device 210. In some implementations, one or more blocks of process 600 may be performed by one or more devices instead of, or possibly in conjunction with, computing device 210.

Process 600 may include receiving abstract nodes (block 610). For example, a user may cause computing device 210 (e.g., TCE 220) to create or open a user interface. The user interface may not include any abstract nodes. The user may then add abstract nodes to the user interface. For example, in some implementations, computing device 210 may receive a command, from the user, that indicates that an abstract node is to be added to the user interface. Computing device 210 may receive the command based, for example, on detecting a selection of a particular menu item, entry of a particular textual or audible input from the user, and/or entry of some other predetermined input that identifies the desire to add an abstract node to the user interface. Based on the command, computing device 210 may add the abstract node to the user interface.

Process 600 may include receiving characteristics for the abstract nodes (block 620). For example, computing device 210 (e.g., TCE 220) may provide a user interface, to the user, that allows the user to specify characteristics to be associated with each added abstract node. The user interface may allow the user to specify, for an abstract node, any of the characteristics discussed above with respect to block 430 of FIG. 4. For example, the user interface may allow the user to specify a quantity of input ports for an abstract node, a quantity of output ports for the abstract node, a physical time delay that is associated with the abstract node, a logical time delay that is associated with the abstract node, one or more characteristics relating to memory consumption and/or accesses, an execution order for the abstract node, etc.

In some implementations, the user interface may allow the user to specify an algorithm that is to be associated with the abstract node. The algorithm may, for example, be a simpler version of the algorithm or a portion of the algorithm that is associated with a concrete node with which the abstract node corresponds. The user interface may allow the user to specify a location from which the algorithm is to be executed. The location may correspond to a location that is local to computing device 210 or remote from computing device 210, such as a location that is reachable via a network.

In some implementations, computing device 210 may allow the user to specify characteristics in another manner. For example, computing device 210 may allow the user to specify a concrete node of a computational graph from which the characteristics are to be obtained. As another example, computing device 210 may allow the user to specify a particular file that includes the characteristics that are to be used for the abstract node.

Process 600 may include receiving information relating to connections of the abstract nodes to form a computational graph (block 630). For example, computing device 210 (e.g., TCE 220) may allow the user to specify how the abstract nodes are to be connected. In some implementations, computing device 210 may allow the user to connect a particular output port of one abstract node to an input port of another abstract node. In some implementations, computing device 210 may allow the user to perform this operation using a drawing tool (e.g., where the user may draw a line from the output port of the one abstract node to the input port of the other abstract node). In some implementations, computing device 210 may provide a user interface that allows the user to specify, for a connection, the output port of the one abstract node and the input port of the other abstract node. Computing device 210 may allow the user to specify a connection between abstract nodes in other ways.

Process 600 may include storing the computational graph (block 640). For example, computing device 210 (e.g., TCE 220) may store the computational graph in a memory location. In some implementations, computing device 210 may receive information, identifying a memory location, from the user and may store the computational graph at the identified memory location.

While FIG. 6 shows process 600 as including a particular quantity and arrangement of blocks, in some implementations, process 600 may include fewer blocks, additional blocks, or a different arrangement of blocks. Additionally, or alternatively, some of the blocks may be performed in parallel.

FIGS. 7A-7D are an example 700 of process 600 described above with respect to FIG. 6. As shown in relation to FIG. 7A, computing device 210 may provide a user interface that includes a first area 710 and a second area 720. First area 710 may provide a list of abstract nodes from which the user may select. The abstract nodes may be pre-configured with a particular quantity of input ports and output ports. For example, the abstract node, identified with "1 in" and "1 out," may correspond to an abstract node that includes a single input and a single output. Similarly, the abstract node, identified with "N in" and "N out," may correspond to an abstract node for which the user may be asked to specify the quantity of input ports and the quantity of output ports. In some implementations, the particular abstract nodes in first area 710 may be selected, for including in first area 710, based on a set of concrete nodes that the user has identified (e.g., by selecting a computational graph). In some implementations, second area 720 may be automatically populated with a group of abstract nodes based on a set of concrete nodes that the user has identified (e.g., by selecting a computational node).

Figure 7A:
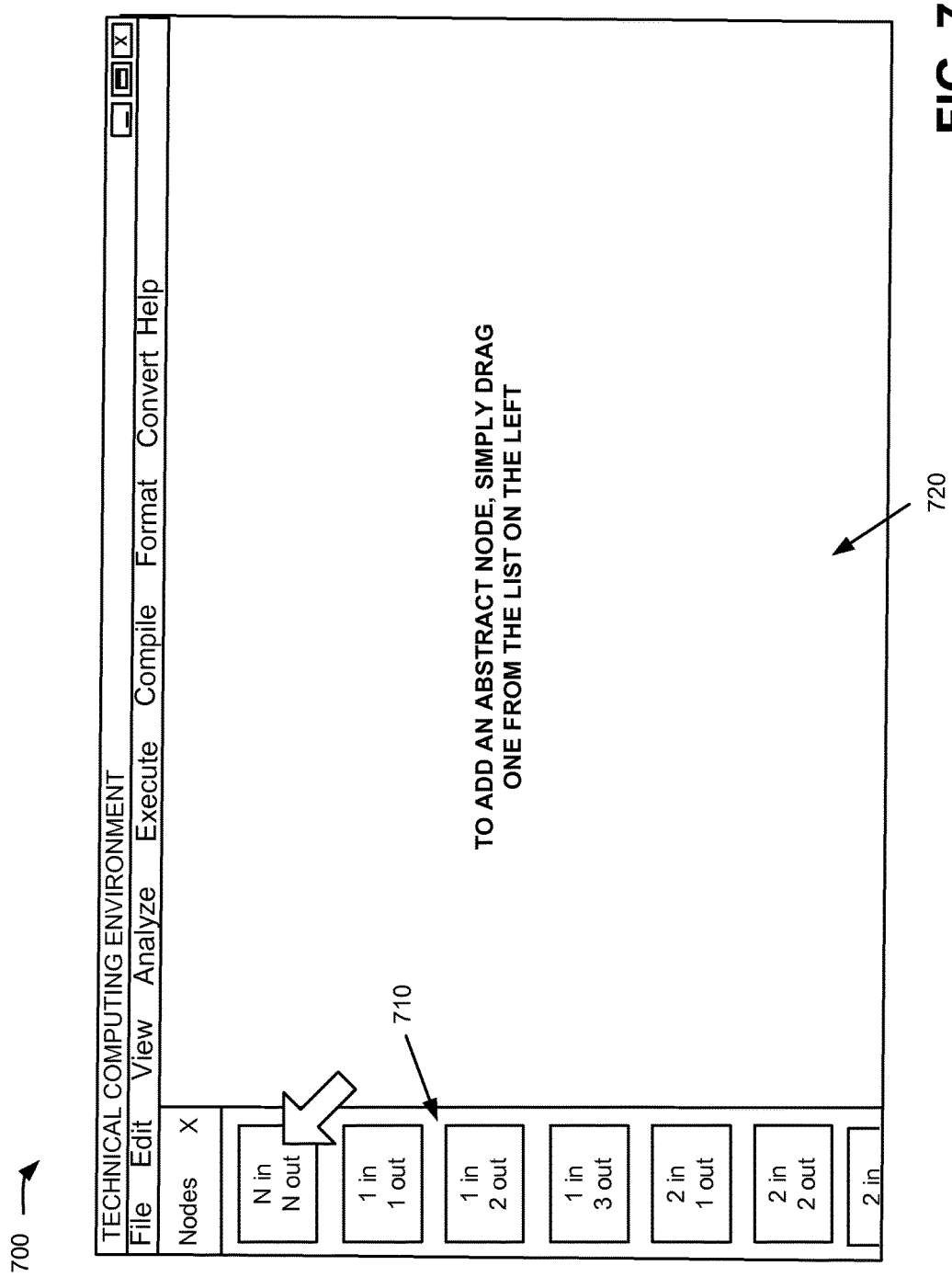
FIGS. 7A-7D are an example of the process described in FIG. 6.
Figure 7B:
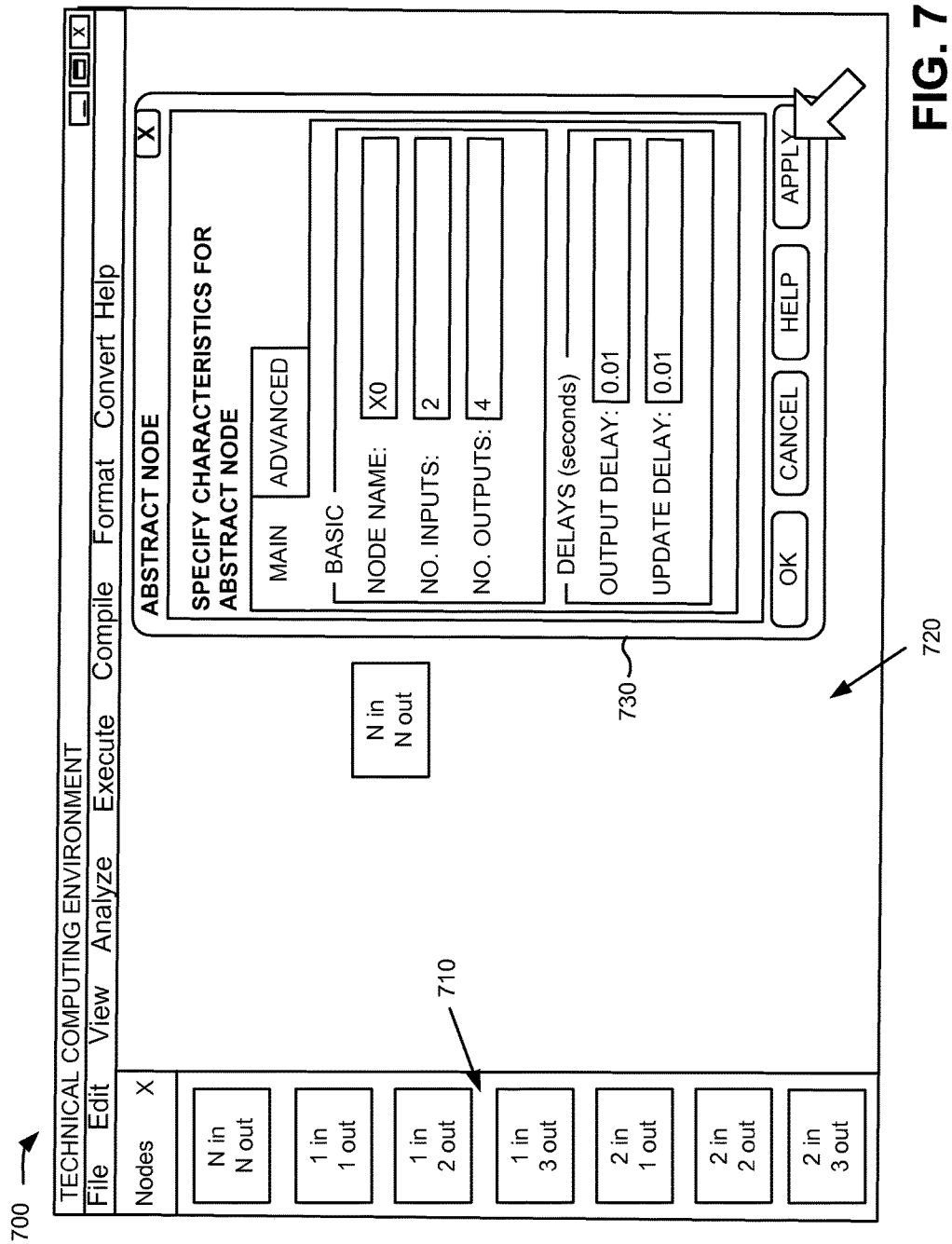

Second area 720 may act as a blank canvas for receiving abstract nodes. To add an abstract node, the user may drag the desired abstract node from first area 710 to second area 720. Assume, for example 700, that the user drags the "N in" and "N out" abstract block to second area 720, as shown in FIG. 7B. Based on adding the "N in" and "N out" abstract block to second area 720, computing device 210 may cause a user interface 730 to be provided to the user. User interface 730 may allow the user to specify characteristics of the added abstract block. As shown, user interface 730 may allow the user to specify a name for the abstract node, a quantity of input ports, a quantity of output ports, and one or more physical time delays associated with the abstract node. User interface 730 may allow the user to specify other characteristics, such as a logical time delay, characteristics relating to memory consumption and/or accesses, a location of an algorithm with which the abstract node is to be associated, etc. In some implementations, user interface 730 may allow the user to specify time delays (physical and/or logical) with some degree of variance. For example, user interface 730 may allow the user to specify the output delay as 10 milliseconds+/−1 millisecond.

Figure 7C:
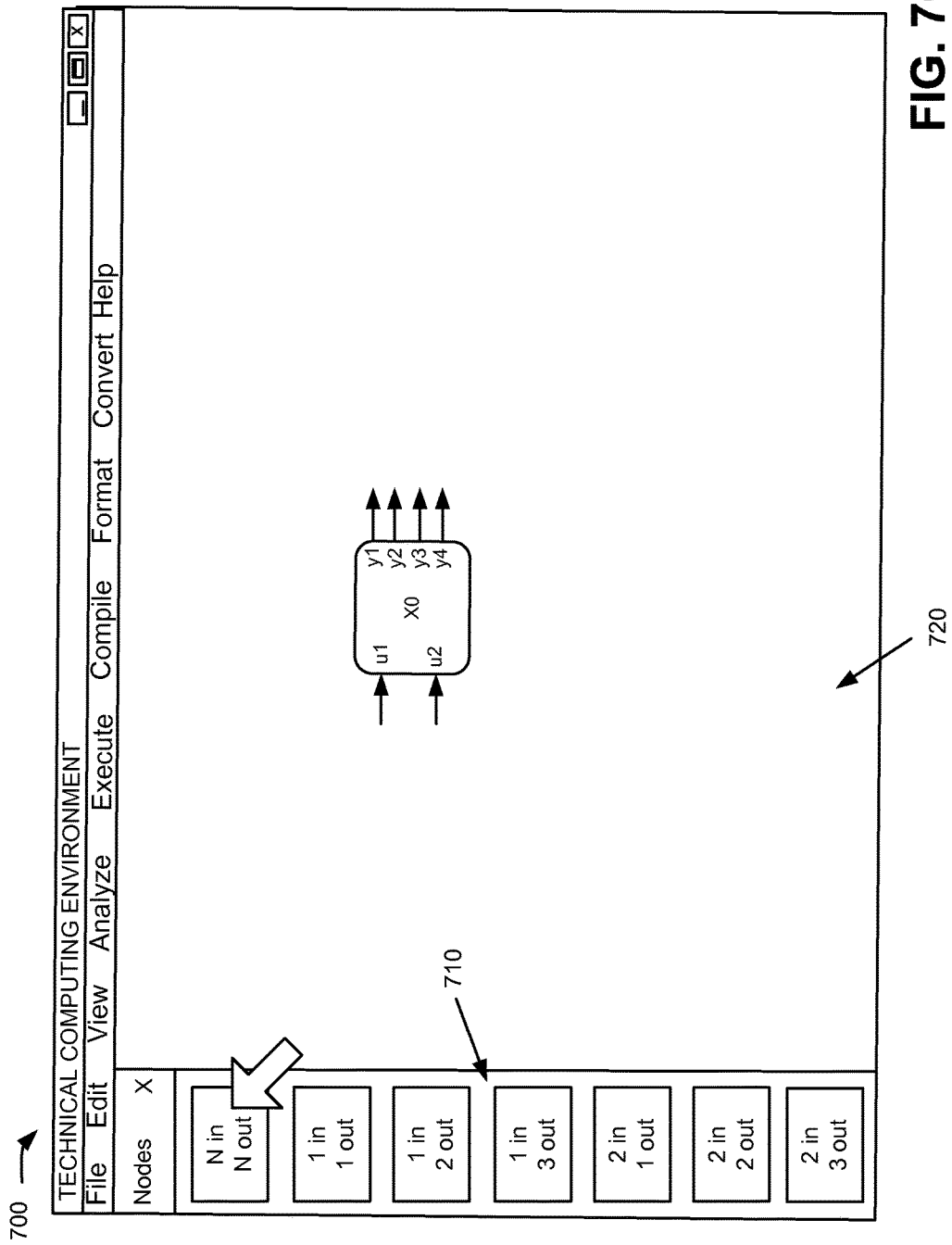
Figure 7D:
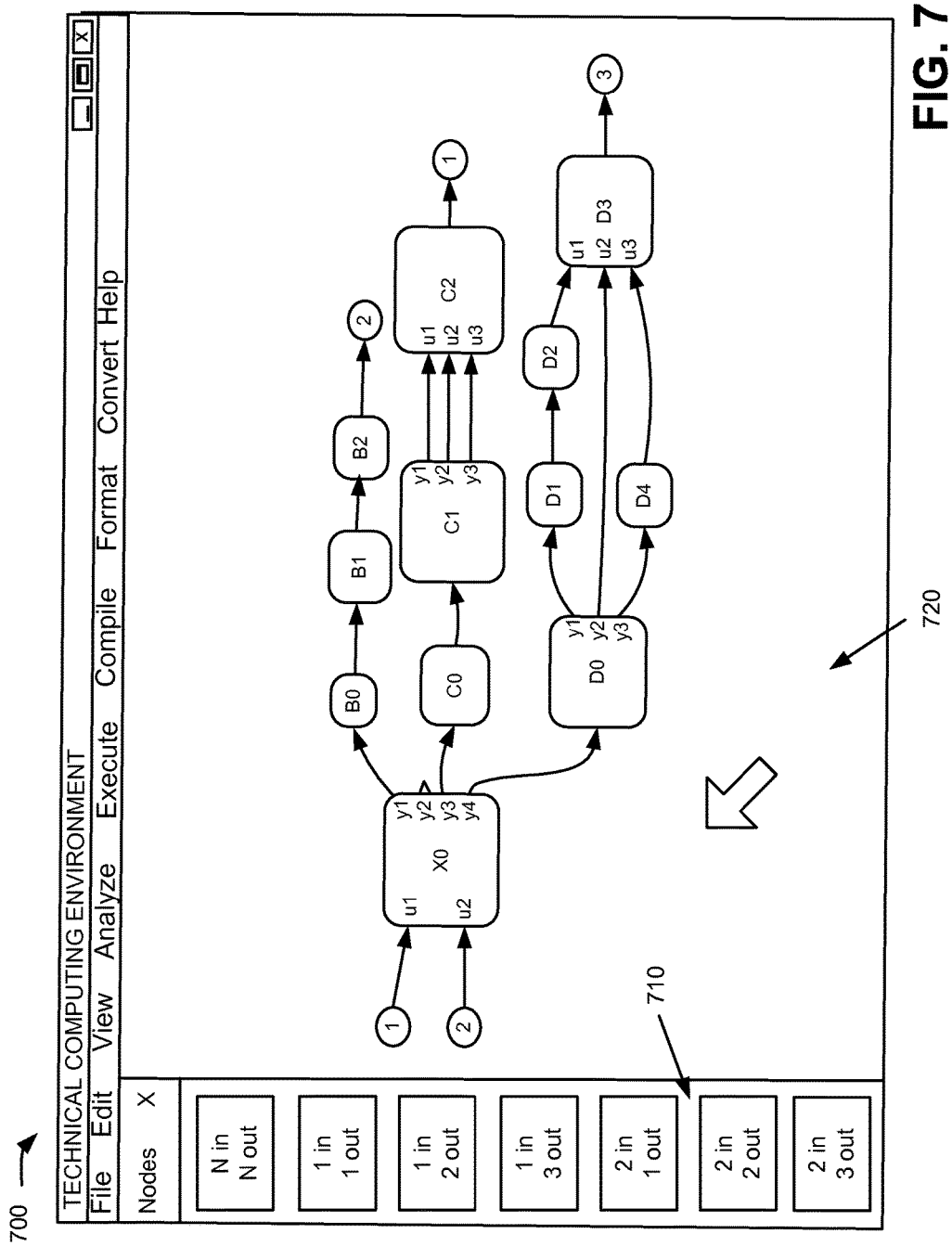

Once a user has specified the desired characteristics, computing device 210 may display the newly added abstract node, having the desired characteristics in second area 720, as shown in FIG. 7C. The user may continue to drag abstract nodes into second area 720 and connect the abstract nodes in the desired manner, until the desired quantity and arrangement of abstract nodes has been achieved, as illustrated in FIG. 7D.

Once a computational graph with abstract nodes has been created, a user may wish to change the characteristics with which the abstract nodes are associated based on, for example, behavioral data obtained by executing the computational graph, learning more about the concrete nodes with which the abstract nodes are associated, etc. For example, the user may initially create a computational graph that includes the same abstract nodes (e.g., abstract nodes with simply 1 input and 1 output) that are interconnected in a desired manner. Over time, the user may learn more about the concrete nodes with which the abstract nodes correspond (e.g., by analyzing and/or executing the computational graph with the abstract nodes). The user may increase the level of fidelity of the abstract nodes by adding characteristics of the concrete nodes, such as changing the quantity of input ports and output ports of an abstract node, adding timing or memory characteristics to the abstract node, causing the abstract node to execute a different (e.g., simpler) algorithm than the actual algorithm that the corresponding concrete node is going to execute, etc. In some instances, the actual algorithm that a concrete node will implement may become available and the user may cause the abstract node to execute the actual algorithm as part of executing the computational graph. Thus, over time, the user may increase the fidelity of the abstract nodes by associating additional characteristics from the corresponding concrete nodes.

Figure 8:
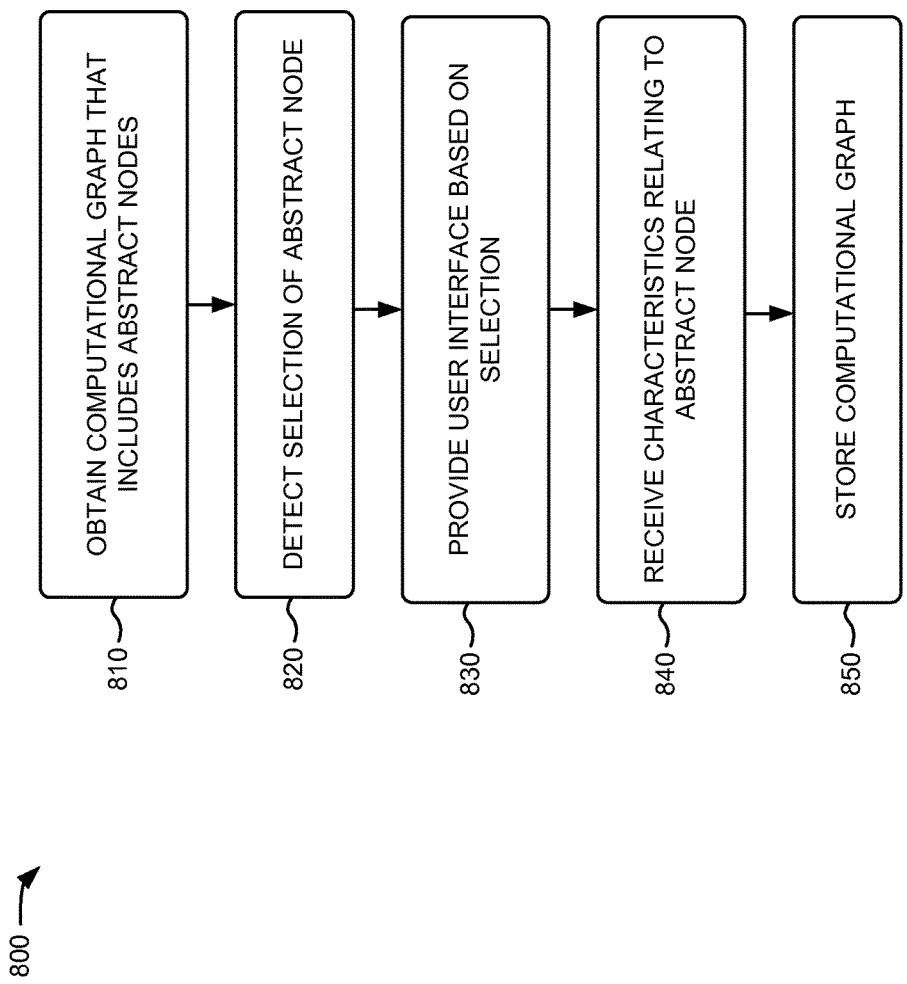
FIG. 8 is a flowchart of an example process for changing the level of fidelity of an abstract node.

FIG. 8 is a flowchart of an example process 800 for changing the level of fidelity of an abstract node. In some implementations, process 800 may be performed by computing device 210. In some implementations, one or more blocks of process 800 may be performed by one or more devices instead of, or possibly in conjunction with, computing device 210.

Process 800 may include obtaining a computational graph that includes abstract nodes (block 810). For example, computing device 210 (e.g., TCE 220) may receive a request, from a user of computing device 210, to access a computational graph that includes abstract nodes. The request may include information identifying the computational graph, such as a name of the computational graph, and information identifying a memory location at which the computational graph is stored. The memory location may be located within computing device 210 or external to, and possibly remote from, computing device 210. Computing device 210 may, based on receiving the request, retrieve the computational graph from the memory location. In some implementations, computing device 210 may provide, for display, a user interface that depicts all or a portion of the computational graph.

Process 800 may also include detecting selection of an abstract node in the computational graph (block 820). For example, computing device 210 (e.g., TCE 220) may detect selection of an abstract node based on a user clicking (or double clicking) on the abstract node in the user interface, highlighting the abstract node in the user interface, identifying the abstract node via a textual or audible input of the user, identifying the abstract node via a menu item selection, or in another manner.

Process 800 may include providing a user interface based on the selection of the abstract node (block 830). For example, computing device 210 (e.g., TCE 220) may cause a user interface to be provided, to the user, based on the detected selection of the abstract node. In some implementations, the user interface may be pre-populated with information identifying the current characteristics of the abstract node. In some implementations, the user interface may allow the user to alter the characteristics with which the abstract node is associated. For example, the user interface may allow the user to increase the level of fidelity of the abstract node by associating additional characteristics with the abstract node. By way of example, assume that the characteristics, associated with the abstract node, include that the abstract node has 3 inputs and 1 output and that the abstract node is associated with a physical time delay of 200 milliseconds. The user interface may allow the user to specify additional characteristics to be associated with the abstract node, such as characteristics relating to memory consumption and/or memory accesses, an algorithm with which the abstract node is to be associated, etc.

The user interface may also allow the user to decrease the level of fidelity of the abstract node by removing characteristics that are associated with the abstract node. By way of example, assume that the characteristics, associated with the abstract node, include that the abstract node has 3 inputs and 1 output, that the abstract node is associated with a physical time delay of 200 milliseconds and a logical time delay of 100 milliseconds. The user interface may allow the user to remove characteristics, such as removing the logical time delay.

The user interface may also allow the user to change characteristics associated with the abstract node that neither increase nor decrease the level of fidelity. For example, the user interface may allow the user to change the name associated with the abstract node and/or make another change that neither increases nor decreases the level of fidelity.

Process 800 may include receiving characteristics relating to the abstract nodes (block 840). For example, computing device 210 (e.g., TCE 220) may receive, via the user interface, characteristics to be associated with the abstract node.

Process 800 may include storing the computational graph (block 850). For example, computing device 210 (e.g., TCE 220) may store the computational graph in a memory location. In some implementations, computing device 210 may receive information, identifying a memory location, from the user and may store the computational graph at the identified memory location.

While FIG. 8 shows process 800 as including a particular quantity and arrangement of blocks, in some implementations, process 800 may include fewer blocks, additional blocks, or a different arrangement of blocks. Additionally, or alternatively, some of the blocks may be performed in parallel.

Figure 9A:
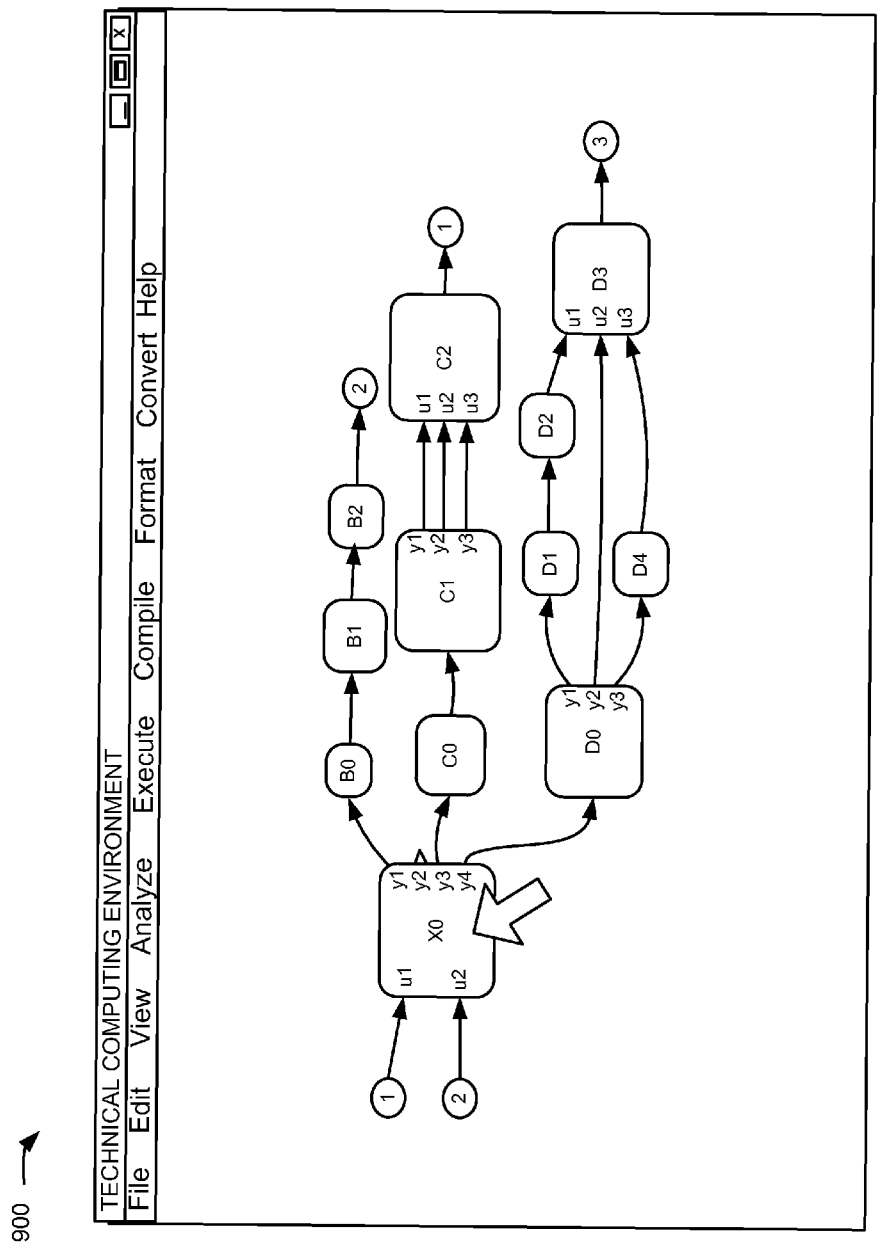
FIGS. 9A-9C are an example of the process described in FIG. 8.
Figure 9B:
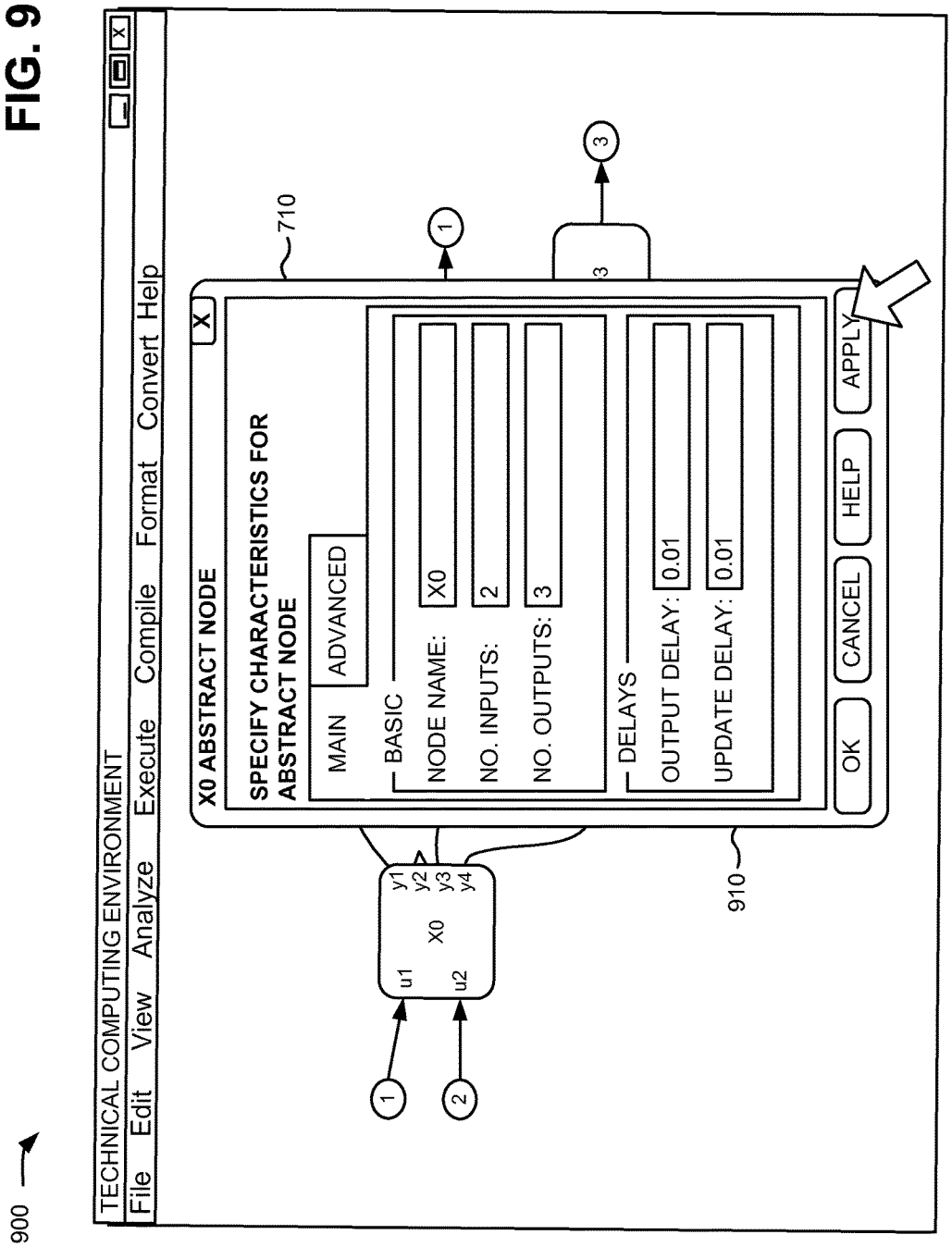
Figure 9C:
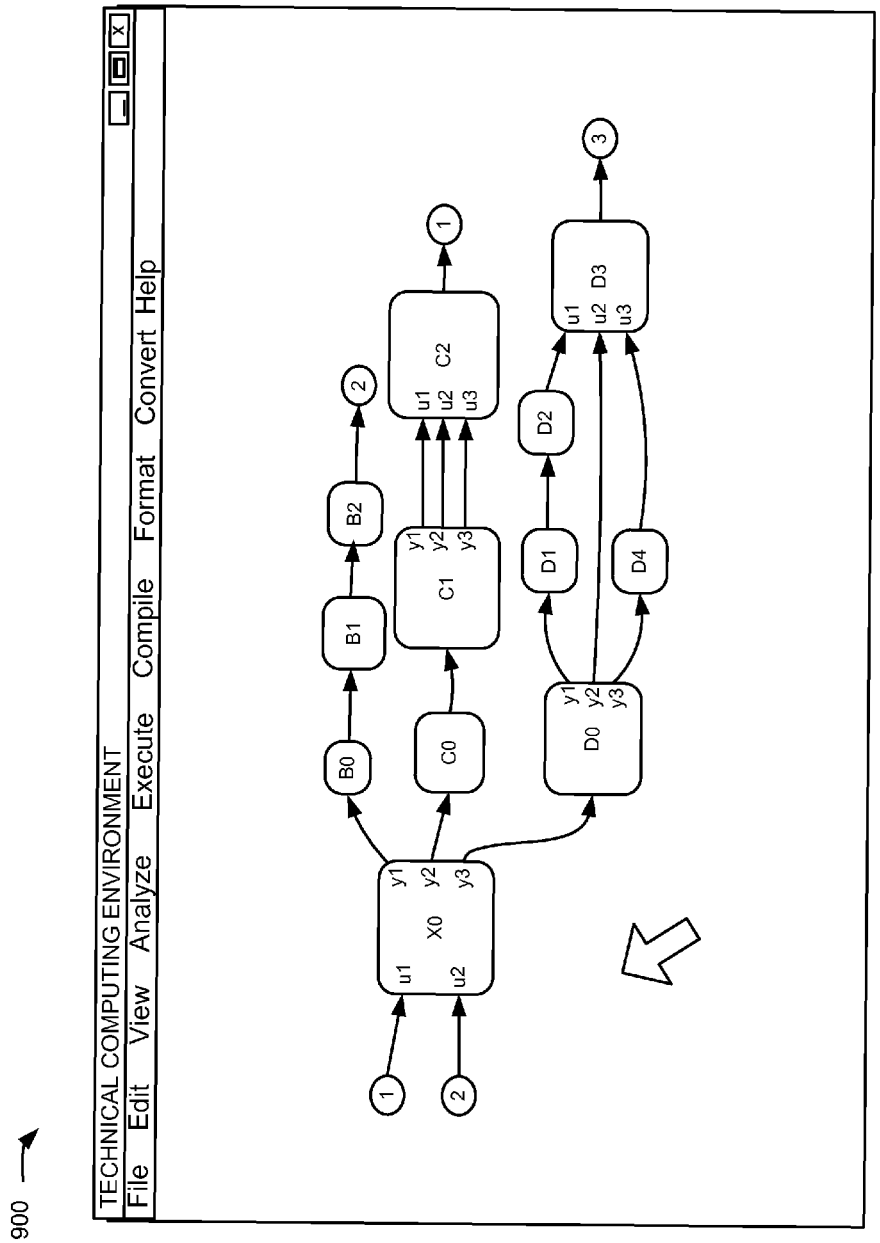

FIGS. 9A-9C are an example 900 of process 800 described above with respect to FIG. 8. As shown in relation to FIG. 9A, computing device 210 may provide a user interface that provides a computational graph. The computational graph may include a group of abstract nodes, identified as X0, B0-B2, C0-C2, and D0-D4. Assume, for example 900, that the user is interested in changing the quantity of output ports of abstract node X0 from 4 to 3. The user may select abstract node X0 by, for example, double clicking on the abstract node in the user interface.

Upon detecting the selection of abstract node X0, computing device 210 may provide a user interface 910, as shown in FIG. 9B. User interface 910 may be pre-populated with information identifying the current characteristics associated with abstract node X0. Since the user is interested in changing the quantity of output ports from 4 to 3, the user may enter the appropriate change into the NO. OUTPUTS field of user interface 910. Upon selection of the APPLY button, the change may be reflected in the computational graph, as shown in FIG. 9C.

FIG. 10 is a flowchart of an example process 1000 for obtaining behavioral data based on analyzing and/or executing a computational graph that includes abstract nodes. In some implementations, process 1000 may be performed by computing device 210. In some implementations, one or more blocks of process 1000 may be performed by one or more devices instead of, or possibly in conjunction with, computing device 210.

Process 1000 may include obtaining a computational graph that includes abstract nodes (block 1010). For example, computing device 210 (e.g., TCE 220) may receive a request, from a user of computing device 210, to access a computational graph that includes abstract nodes. The request may include information identifying the computational graph, such as a name of the computational graph, and information identifying a memory location at which the computational graph is stored. The memory location may be located within computing device 210 or external to, and possibly remote from, computing device 210. Computing device 210 may, based on receiving the request, retrieve the computational graph from the memory location. In some implementations, computing device 210 may provide, for display, a user interface that depicts all or a portion of the computational graph.

Process 1000 may include receiving a command to analyze or execute the computational graph (block 1020). For example, computing device 210 (e.g., TCE 220) may receive a command, from the user, to analyze or execute the computational graph. In some implementations, computing device 210 may receive the command based on detecting a selection of a particular menu item, entry of a particular textual or audible input from the user, and/or entry of some other predetermined input that identifies the desire to analyze or execute the computational graph.

In some implementations, computing device 210 may request that the user identify particular characteristics to be analyzed during an analysis or execution of the computational graph. For example, computing device 210 may provide, based on receiving the command, a user interface to the user, which allows the user to identify which particular characteristics are of interest to the user. Thus, for example, if the user identified memory consumption as a characteristic of interest, computing device 210 may analyze and/or execute the computational graph and provide behavioral data relating to the memory consumption of the abstract nodes. Computing device 210 may allow the user to specify particular characteristics in other ways.

In some implementations, computing device 210 may request that the user identify a particular execution platform on which all or a portion of the computational graph is to be executed. The particular execution platform may include, for example, a particular type of CPU, a particular type of GPU, an FPGA, an ASIC, multi-core processors, particular cores or sets of cores of multi-core processors, and/or another type of processing device. In some implementations, computing device 210 may provide, based on receiving the command, a user interface to the user, which allows the user to identify a particular execution platform on which particular abstract nodes are to execute. Computing device 210 may allow the user to specify a particular execution platform in other ways.

Process 1000 may include analyzing or executing the computational graph to obtain behavioral data (block 1030). For example, computing device 210 (e.g., TCE 220) may, upon detection of a command to analyze the computational graph, analyze the computational graph to obtain behavioral data. As one example, computing device 210 may analyze the computational graph to obtain information relating to the manner in which the abstract nodes are connected (e.g., which outputs are connected to which inputs), the memory locations that are assigned to particular connections, the algorithms that are actually going to be executed, the order in which the abstract nodes are going to be executed, physical time delays associated with the abstract nodes, logical time delays associated with the abstract nodes, memory consumption and memory accesses associated with the abstract nodes, and/or other information relating to size, performance, or ordering.

Computing device 210 (e.g., TCE 220) may, upon detection of a command to execute the computational graph, execute the computational graph to obtain behavioral data. As one example, computing device 210 may obtain some or all of the behavioral data identified above with respect to an analysis of the computational graph. In addition, computing device 210 may stream changes in some or all the behavioral data obtained during an analysis of the computational graph. For example, if the behavioral data, associated with a particular abstract node, changes during execution of the computational graph, computing device 210 may provide the new behavioral data while the computational graph is executing.

Process 1000 may include providing behavioral data based on analyzing and/or executing the computational graph (block 1040). For example, computing device 210 (e.g., TCE 220) may provide, to the user, the obtained behavioral data. The behavioral data may include any information that may be useful in the exploration and/or testing phases of the design or manufacture of a computational system. For example, the behavioral data may relate to performance optimization, computational system testing, and/or design space exploration.

In some implementations, computing device 210 may provide a report that includes the behavioral data. The report may be presented as a separate user interface (e.g., a popup window) or a printable document. The report may include some or all of the obtained behavioral data. The behavioral data may be presented, in the report, as one or more textual lists, as one or more plots, as one or more bar graphs, as one or more charts, and/or in some other manner. In some implementations, the user may select the form that the behavioral data is presented and the behavioral data that is to be included in the report.

As one example of the behavioral data that may be provided to the user, computing device 210 may provide a report relating to memory consumption. For example, the report may identify the quantity of abstract nodes in the computational graph, the quantity of connections (i.e., the lines connecting the abstract nodes), the amount of memory used by each connection, the total amount of memory used by all the connections, etc. In some implementations, the report may be sorted (or sortable upon command from the user) based on one or more pieces of the behavioral data.

As another example, computing device 210 may provide a report relating to the timing of the computational graph. For example, the report may identify the execution time of each abstract node, including the maximum execution time and the minimum execution time. The report may also identify the total execution time of the computational graph (e.g., by summing the execution times of the abstract nodes). The report may also identify the execution time of a particular segment of the computational graph, such as a particular chain of abstract nodes. For example, and with reference to FIG. 9C, the report may identify the execution times of the chain that includes abstract nodes B0-B2, the chain that includes abstract nodes C0-C2, and the chain that includes abstract nodes D0-D4. In some implementations, the report may be sorted (or sortable upon command from the user) based on one or more pieces of the behavioral data.

In some implementations, the report may provide a comparison of the obtained behavioral data to behavioral data obtained from the corresponding computational graph that includes concrete nodes. For example, the report may include a table, where each row includes the execution time of an abstract node and the execution time of the corresponding concrete node. In this way, the user may quickly compare the performance of an abstract node with the corresponding concrete node.

In some implementations, computing device 210 may annotate the computational graph with some or all of the behavioral data. For example, computing device 210 may annotate the computational graph with the timing information, memory information, and/or other types of information.

In some implementations, computing device 210 may provide one or more interfaces that depict the computational graph with the abstract nodes and a corresponding computational graph with concrete nodes. In these implementations, computing device 210 may highlight portions of the computational graph and/or the corresponding computational graph (e.g., by highlighting one or more abstract nodes, one or more concrete nodes, and/or one or more pieces of behavioral data) based on differences in behavioral data obtained from the computational graph and the corresponding computational graph. By way of example, assume that analysis of an abstract node indicates a logical time delay of 100 milliseconds and that analysis of the corresponding concrete node indicates a logical time delay of 500 milliseconds. In this example, computing device 210 may highlight the abstract node and/or the concrete node in the one or more user interfaces. Moreover, computing device 210 may annotate one or both computational graphs with information identifying the different logical time delays. Computing device 210 may provide the behavioral data in other ways than described above.

While FIG. 10 shows process 1000 as including a particular quantity and arrangement of blocks, in some implementations, process 1000 may include fewer blocks, additional blocks, or a different arrangement of blocks. Additionally, or alternatively, some of the blocks may be performed in parallel.

FIGS. 11A-11D are an example 1100 of process 1000 described above with respect to FIG. 10. As shown in relation to FIG. 11A, computing device 210 may provide a user interface that provides a computational graph. The computational graph may include a group of abstract nodes, identified as X0, B0-B2, C0-C2, and D0-D4. Assume, for example 1100, that the user wants to obtain behavior data relating to the computational graph. The user may select the ANALYZE menu item or the EXECUTION menu item to obtain behavioral data. Assume that the user selects the ANALYZE menu item and computing device 210 analyzes the computational graph to obtain behavioral data.

With reference to FIG. 11B, computing device 210 may provide the behavioral data in the form of a report 1110. In example 1100, assume that the user is interested in timing information relating to the computational graph. As shown in FIG. 11B, report 1110 may include execution times of each of the abstract nodes, sorted in order from slowest executing abstract node (i.e., abstract nodes X0 and B0) to fastest executing abstract node (i.e., abstract nodes B2, D0, and D3). Report 1110 may also include timing information relating to chains of abstract nodes in the computational graph, sorted in order from the slowest chain (i.e., chain D0-D4) to fastest chain (i.e., chain B0-B2). In addition, report 1110 may provide other or different information, such as information identifying the fastest executing abstract node, the slowest executing abstract node, the fastest executing chain of abstract nodes, and the slowest executing chain of abstract nodes.

Figure 11A:
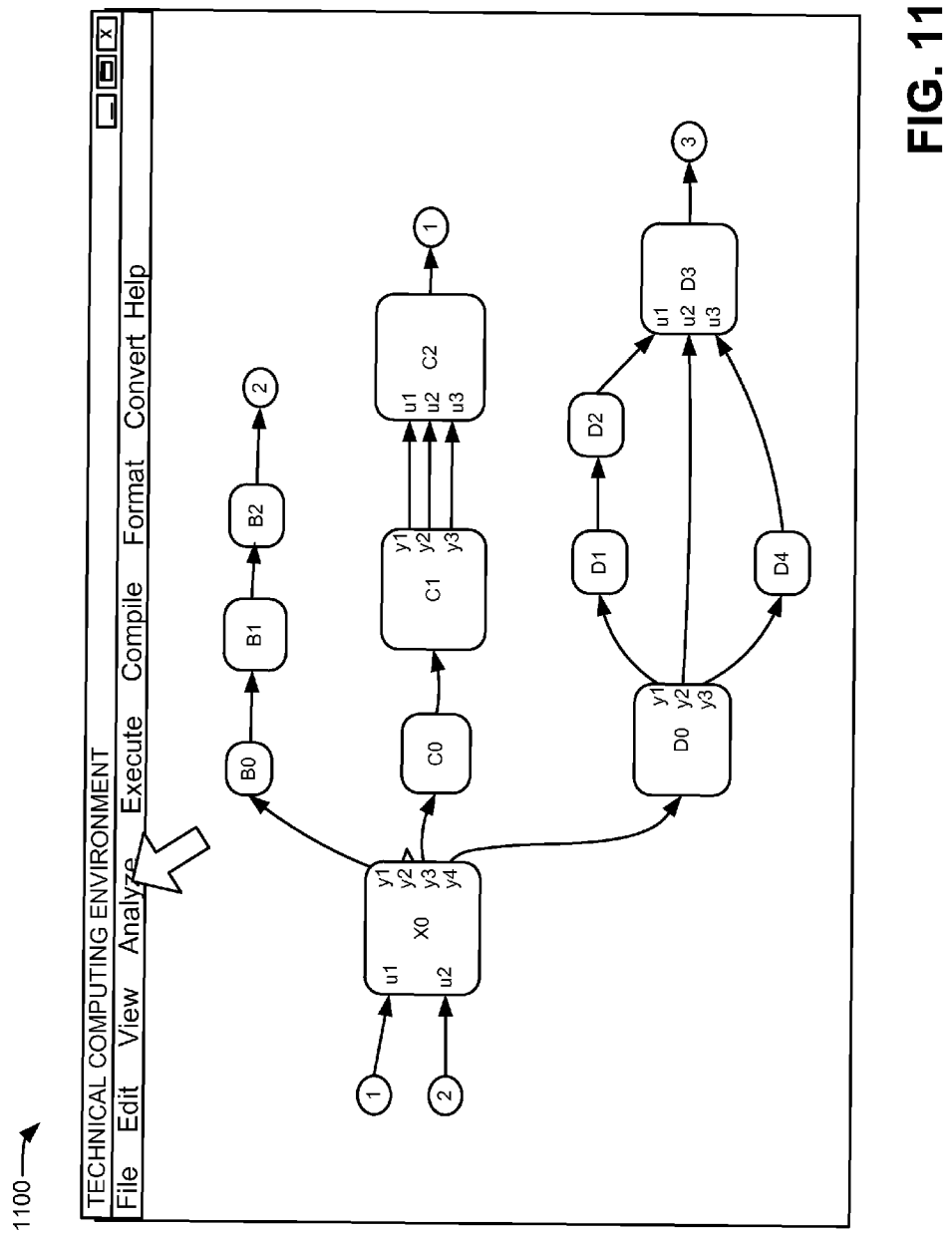
Figure 11C:
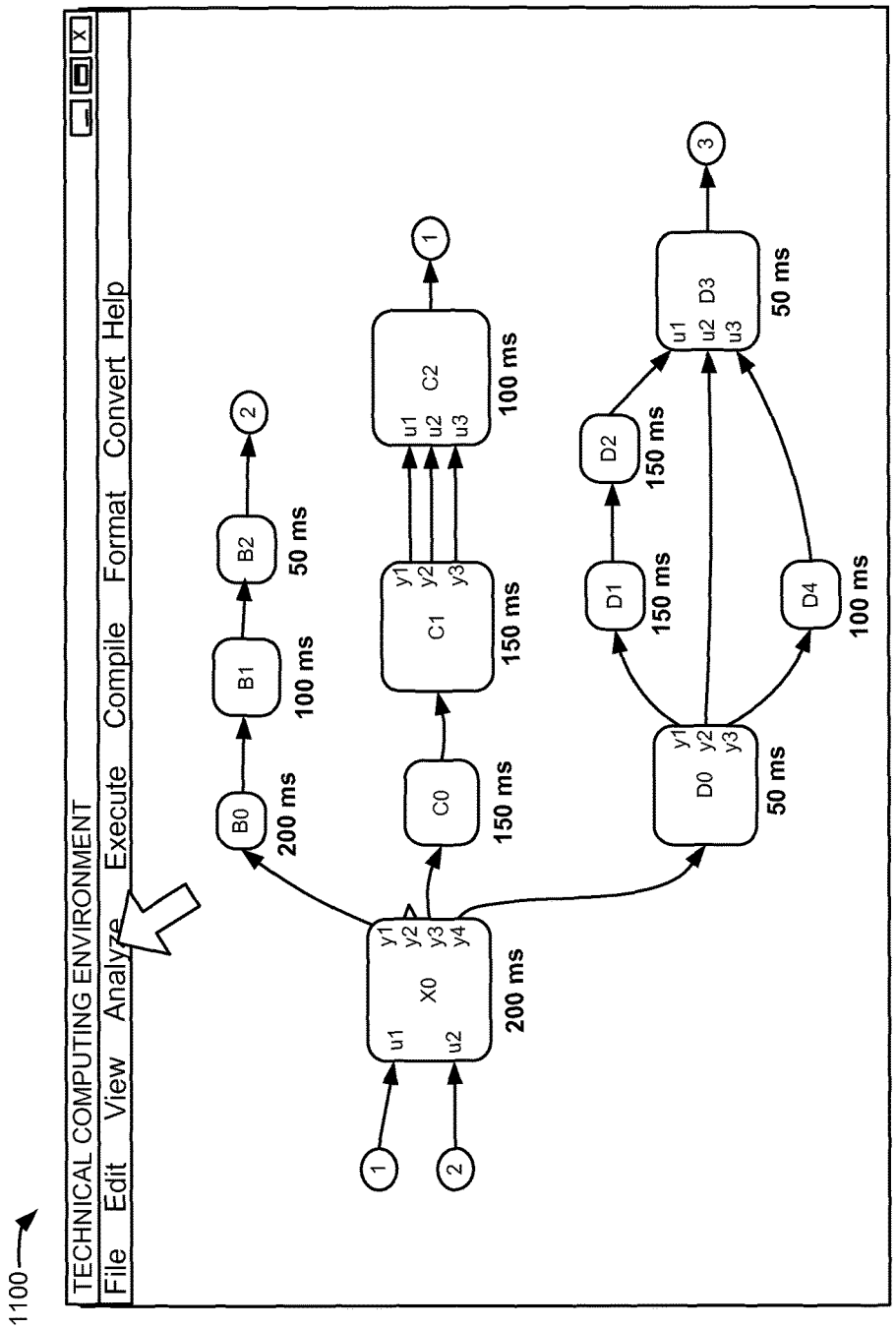

With reference to FIG. 11C, computing device 210 may provide the timing behavioral data by annotating the computational graph. For example, computing device 210 may annotate the computational graph by including, in connection with each abstract node, the execution time of the abstract node. As one example, abstract node X0 may be associated with an execution time of 200 milliseconds. Thus, computing device 210 may annotate the computational graph by indicating the execution time of 200 milliseconds in connection with abstract node X0. Computing device 210 may annotate the user interface with additional or different behavioral data, such as execution orders of the abstract nodes, data types, data sizes, etc.

Figure 11D:
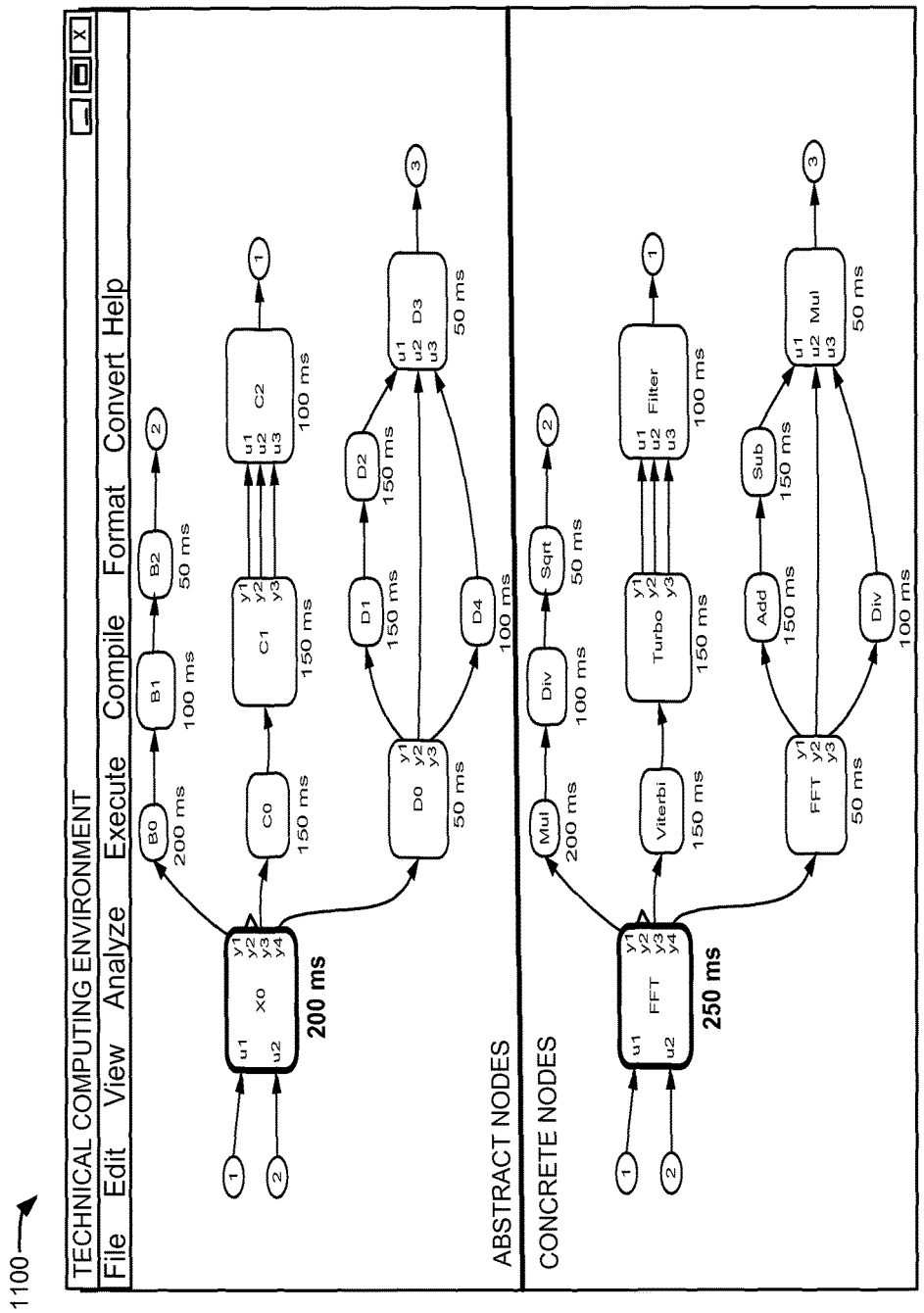

With reference to FIG. 11D, computing device 210 may provide a user interface that depicts the computational graph with the abstract nodes and the corresponding computational graph with the concrete nodes. In some implementations, computing device 210 may highlight behavioral differences between the computational graphs. For example, assume that computing device 210 executes the computational graph and determines that the execution time of abstract node X0 is 200 milliseconds, which is different than the execution time of the corresponding concrete node (i.e., the left-most FFT node in FIG. 11D). Computing device 210 may provide a user interface that depicts the abstract nodes and the concrete nodes. Computing device 210 may highlight, in the user interface, the nodes where the execution times are different. Thus, in FIG. 11D, computing device 210 may highlight abstract node X0 and the corresponding FFT node.

Systems and methods, described herein, may provide an abstract node that may be used in place of a concrete node in a computational graph. The abstract node may characterize different aspects of the concrete node. A designer of a computational system may analyze and/or execute the computational graph that includes abstract nodes for performance optimization purposes, design space exploration purposes, and/or computational system testing purposes.

The foregoing description provides illustration and description, but is not intended to be exhaustive or to limit the implementations to the precise form disclosed. Modifications and variations are possible in light of the above disclosure or may be acquired from practice of the implementations.

As used herein, the term component is intended to be broadly interpreted to refer to hardware or a combination of hardware and software, such as software executed by a processor.

It will be apparent that systems and methods, as described above, may be implemented in many different forms of software, firmware, and hardware in the implementations illustrated in the figures. The actual software code or specialized control hardware used to implement these systems and methods is not limiting of the implementations. Thus, the operation and behavior of the systems and methods were described without reference to the specific software code—it being understood that software and control hardware can be designed to implement the systems and methods based on the description herein.

Even though particular combinations of features are recited in the claims and/or disclosed in the specification, these combinations are not intended to limit the disclosure of the possible implementations. In fact, many of these features may be combined in ways not specifically recited in the claims and/or disclosed in the specification. Although each dependent claim listed below may directly depend on only one other claim, the disclosure of the possible implementations includes each dependent claim in combination with every other claim in the claim set.

No element, act, or instruction used in the present application should be construed as critical or essential unless explicitly described as such. Also, as used herein, the article "a" is intended to include one or more items and may be used interchangeably with the phrase "one or more." Where only one item is intended, the term "one" or similar language is used. Further, the phrase "based on" is intended to mean "based, at least in part, on" unless explicitly stated otherwise.

What is claimed is:

1. A device comprising:
   a processor to:
      receive information specifying a first physical time delay of a computational node of a first computational graph,
         the computational node implementing a first algorithm when the first computational graph is executed,
         the first computational graph representing at least a portion of a dynamic system,
         the first computational graph including a plurality of computational nodes that are connected in a particular manner, and
         the computational node being one of the plurality of computational nodes, add an abstract node to a second computational graph based on the received information,
the abstract node corresponding to the computational node of the first computational graph,
the abstract node implementing a second physical time delay, which relates to the first physical time delay, when the second computational graph is executed,
the abstract node implementing a second algorithm when the second computational graph is executed,
the second algorithm being different than the first algorithm,
the second computational graph including a plurality of abstract nodes that are connected in the particular manner, and
the abstract node being one of the plurality of abstract nodes, execute the second computational graph, and
obtain one or more behavioral characteristics of the at least the portion of the dynamic system based on executing the second computational graph.

2. The device of claim 1, where the processor is further to:
receive second information identifying a quantity of ports of the computational node, and
where the processor, when adding the abstract node, is further to:
add the abstract node to the second computational graph further based on the second information,
the abstract node including the quantity of ports.

3. The device of claim 1, where the second computational graph is different than the first computational graph.

4. The device of claim 1, where the processor is further to:
receive second information specifying at least one of a data type or a data size that is associated with the computational node,
where the processor, when adding the abstract node to the second computational graph, is to:
add the abstract node to the second computational graph further based on the second information, and
where the processor, when executing the second computational graph, is to:
cause the abstract node to receive or output data having the at least one of the data type or the data size.

5. The device of claim 1, where the processor is further to:
receive second information specifying a first logical time delay that is associated with the computational node,
where the processor, when adding the abstract node to the second computational graph, is to:
add the abstract node to the second computational graph further based on the second information, and
where the processor, when executing the second computational graph, is to:
cause the abstract node to implement a second logical time delay that relates to the first logical time delay.

6. The device of claim 1, where the processor is further to:
receive second information specifying at least one of a first quantity of memory read operations that are associated with the computational node or a second quantity of memory write operations that are associated with the computational node,
where the processor, when adding the abstract node to the second computational graph, is to:
add the abstract node to the second computational graph further based on the second information, and
where the processor, when executing the second computational graph, is to:
cause the abstract node to implement the at least one of the first quantity of memory read operations or the second quantity of memory write operations.

7. The device of claim 1, where the processor is further to:
receive second information specifying a quantity of memory that is associated with the computational node,
where the processor, when adding the abstract node to the second computational graph, is to:
add the abstract node to the second computational graph further based on the second information, and
where the processor, when executing the second computational graph, is to:
cause the abstract node to use the quantity of memory.

8. The device of claim 1, where the first computational graph is associated with an execution order,
the execution order specifying an order in which the plurality of computational nodes are executed when the first computational graph is executed, and
where the processor, when executing the second computational graph, is to:
execute the plurality of abstract nodes in the execution order.

9. The device of claim 1, where the processor is further to:
receive information specifying the second algorithm,
the information specifying the second algorithm being received from a user.

10. The device of claim 1, where processor is further to:
receive, during multiple different time periods, information identifying additional characteristics for the plurality of abstract nodes,
the additional characteristics increasing, for each of the multiple different time periods, a degree to which the plurality of abstract nodes mirror the plurality of computational nodes, and
associate the additional characteristics with the plurality of abstract nodes.

11. The device of claim 1, where the processor is further to:
modify at least one abstract node, of the plurality of abstract nodes, based on the obtained one or more behavioral characteristics to obtain a modified second computational graph,
execute the modified second computational graph, and
obtain one or more other behavioral characteristics of the at least the portion of the dynamic system based on executing the modified second computational graph.

12. The device of claim 11, where the processor is further to:
create a third computational graph based on the one or more other behavioral characteristics,
where the processor, when creating the third computational graph, is to one of:
modify the modified second computational graph, based on information relating to the first computational graph, to create the third computational graph, or
modify the first computational graph, based on the one or more other behavioral characteristics, to create the third computational graph.

13. A non-transitory computer-readable medium for storing instructions, the instructions comprising:
a plurality of instructions, which when executed by a processor, cause the processor to:
receive first information specifying a first physical time delay of a computational node of a first computational graph, the computational node implementing a first algorithm when the first computational graph is executed,
the first computational graph representing at least a portion of a dynamic system,
the first computational graph including a plurality of computational nodes that are connected in a particular manner, and
the computational node being one of the plurality of computational nodes,
receive second information specifying a quantity of ports of the computational node,
add an abstract node to a second computational graph based on the first information and the second information,
the abstract node corresponding to the computational node of the first computational graph,
the abstract node implementing a second physical time delay, which relates to the first physical time delay, when the second computational graph is executed,
the abstract node including the quantity of ports,
the abstract node implementing a second algorithm when the second computational graph is executed, the second algorithm being different than the first algorithm,
the second computational graph including a plurality of abstract nodes that are connected in the particular manner, and
the abstract node being one of the plurality of abstract nodes, execute the second computational graph, and
obtain one or more behavioral characteristics of the at least the portion of the dynamic system based on executing the second computational graph.

14. The non-transitory computer-readable medium of claim 13, where the instructions further comprise:
one or more instructions to receive information specifying one or more characteristics associated with the computational node,
where the plurality of instructions to cause the processor to add the abstract node include:
one or more instructions to cause the processor to add the abstract node based on the information specifying the one or more characteristics, and
where the plurality of instructions to cause the processor to execute the second computational graph include:
one or more instructions to cause the abstract node to exhibit the one or more characteristics.

15. The non-transitory computer-readable medium of claim 14, where the one or more characteristics include at least one of:
a characteristic relating to a logical time delay,
a characteristic relating to a data type,
a characteristic relating to a data size,
a characteristic relating to quantity of memory,
a characteristic relating to a quantity of memory write operations,
a characteristic relating to a quantity of memory read operations,
a characteristic relating to power consumption,
a characteristic relating to a quantity of messages sent or received, or
a characteristic relating to a quantity of interrupt routine invocations.

16. The non-transitory computer-readable medium of claim 13, where the instructions further comprise:
one or more instructions to receive, during multiple different time periods, information identifying additional characteristics for the plurality of abstract nodes,
the additional characteristics increasing, for each of the multiple different time periods, a degree to which the plurality of abstract nodes mirror the plurality of computational nodes, and
one or more instructions to associate the additional characteristics with the plurality of abstract nodes.

17. The non-transitory computer-readable medium of claim 13, where the instructions further comprise:
one or more instructions to provide information identifying the obtained one or more behavioral characteristics to a user,
the information identifying the obtained one or more behavioral characteristics being provided:
as a report, or
by annotating the second computational graph with the information identifying the obtained one or more behavioral characteristics.

18. A method comprising:
creating a first computational graph that includes a plurality of abstract nodes,
each abstract node, of the plurality of abstract nodes, corresponding to a different computational node of a plurality of computational nodes in a second computational graph,
the second computational graph representing at least a portion of a dynamic system,
the plurality of computational nodes being connected in a particular manner, and
each computational node, of the plurality of computational nodes, being associated with a first quantity of characteristics,
each abstract node, of the plurality of abstract nodes, being associated with a second quantity of characteristics,
the second quantity being less than the first quantity,
the plurality of abstract nodes being connected in the particular manner, and
the creating being performed by a computing device;
executing the first computational graph,
the executing being performed by the computing device; and
obtaining one or more behavioral characteristics of the at least the portion of the dynamic system based on executing the first computational graph,
the obtaining being performed by the computing device.

19. The method of claim 18, further comprising:
receiving, during multiple different time periods, information identifying additional characteristics for the plurality of abstract nodes,
the additional characteristics increasing, for each of the multiple different time periods, a degree to which the plurality of abstract nodes mirror the plurality of computational nodes; and
associating the additional characteristics with the plurality of abstract nodes.

20. The method of claim 18, where a first computational node, of the plurality of computational nodes, implements a first version of an algorithm when the second computational graph is executed, and
where a first abstract node, of the plurality of abstract nodes, implements a second version of the algorithm when the first computational graph is executed, the second version being a simpler version of the algorithm relative to the first version.

21. The device of claim 1, where the computational node of the first computational graph is a concrete node, and where the abstract node of the second computational graph is a computational node that is an intermediate form of the concrete node.

* * * * *